United States Patent
Kim et al.

(10) Patent No.: US 11,997,811 B2
(45) Date of Patent: May 28, 2024

(54) BACK COVER AND ELECTRONIC DEVICE INCLUDING THE SAME

(71) Applicant: Samsung Electronics Co., Ltd., Suwon-si (KR)

(72) Inventors: Sungjin Kim, Suwon-si (KR); Hyoungook Jo, Suwon-si (KR); Yanggyun Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 17/540,676

(22) Filed: Dec. 2, 2021

(65) Prior Publication Data
US 2022/0183176 A1    Jun. 9, 2022

Related U.S. Application Data

(63) Continuation of application No. PCT/KR2021/017961, filed on Dec. 1, 2021.

(30) Foreign Application Priority Data

Dec. 4, 2020 (KR) .................. 10-2020-0167954
Apr. 1, 2021 (KR) .................. 10-2021-0042611

(51) Int. Cl.
*H04N 23/51* (2023.01)
*H04N 23/52* (2023.01)
(Continued)

(52) U.S. Cl.
CPC ............... *H05K 5/06* (2013.01); *H04N 23/51* (2023.01); *H04N 23/52* (2023.01); *H04N 23/57* (2023.01); *H04M 1/0264* (2013.01)

(58) Field of Classification Search
None
See application file for complete search history.

(56) References Cited

U.S. PATENT DOCUMENTS 10,574,799 B2     2/2020   Li et al.
11,863,697 B2 *   1/2024   Nguyen Van ......... G06F 1/1656
(Continued)

FOREIGN PATENT DOCUMENTS

CN      107483668 B     5/2019
CN      110149432 A     8/2019
(Continued)

OTHER PUBLICATIONS

International Search Report dated Mar. 31, 2022, issued in International Patent Application No. PCT/KR2021/017961.
(Continued)

*Primary Examiner* — Cynthia Segura
(74) *Attorney, Agent, or Firm* — Jefferson IP Law, LLP

(57) ABSTRACT

An electronic device is provided. The electronic device includes a housing which forms an accommodation space, a front cover coupled to one side of the housing, a back cover coupled to the housing at an opposite side of the front cover, and a camera device disposed in one area of the accommodation space. The back cover includes a plate which covers the other area of the accommodation space and a camera cover which covers the camera device, the camera cover having a first edge coupled to the housing and a second edge coupled to the plate.

18 Claims, 17 Drawing Sheets

(51) Int. Cl.
*H04N 23/57* (2023.01)
*H05K 5/06* (2006.01)
*H04M 1/02* (2006.01)

(56) References Cited

U.S. PATENT DOCUMENTS

| | | |
|---|---|---|
| 2012/0063077 A1 | 3/2012 | Tomobe et al. |
| 2014/0375877 A1* | 12/2014 | Tages .................... G03B 17/56 |
| | | 264/299 |
| 2018/0035204 A1* | 2/2018 | Park ........................ H04M 1/03 |
| 2018/0241861 A1* | 8/2018 | Kim ........................ H04M 1/18 |
| 2022/0006886 A1 | 1/2022 | Huang et al. |
| 2022/0155418 A1* | 5/2022 | Han ....................... H04N 23/52 |
| 2022/0224003 A1* | 7/2022 | Kwak .................... H04N 23/52 |
| 2023/0164251 A1* | 5/2023 | Jung ...................... G03B 11/00 |
| | | 455/556.1 |

FOREIGN PATENT DOCUMENTS

| | | |
|---|---|---|
| EP | 3 716 589 A1 | 9/2020 |
| EP | 4 254 664 A1 | 10/2023 |
| JP | 2010-273213 A | 12/2010 |
| KR | 10-2015-0142386 A | 12/2015 |
| KR | 10-2018-0096178 A | 8/2018 |
| KR | 10-2019-0020474 A | 3/2019 |
| KR | 10-2020-0029415 A | 3/2020 |
| KR | 10-2020-0093015 A | 8/2020 |
| KR | 10-2022-0043665 A | 4/2022 |
| WO | 2020/108247 A1 | 6/2020 |

OTHER PUBLICATIONS

Extended European Search Report dated Feb. 9, 2024, issued in European Application No. 21900986.7-1224.

* cited by examiner

BACK COVER AND ELECTRONIC DEVICE INCLUDING THE SAME

CROSS-REFERENCE TO RELATED APPLICATION(S)

This application is a continuation application, claiming priority under § 365(c), of an International application No. PCT/KR2021/017961, filed on Dec. 1, 2021, which is based on and claims the benefit of a Korean patent application number 10-2020-0167954, filed on Dec. 4, 2020, in the Korean Intellectual Property Office, and of a Korean patent application number 10-2021-0042611, filed on Apr. 1, 2021, in the Korean Intellectual Property Office, the disclosure of each of which is incorporated by reference herein in its entirety.

TECHNICAL FIELD

The disclosure relates to an electronic device including a back cover of the electronic device.

BACKGROUND ART

Recently, with the development of communication technology, electronic devices having various functions have appeared, and such electronic devices may include a high-performance camera module for input of image information. For a cover that forms an exterior of an electronic device, not only sufficient waterproof performance is required to protect a camera module inside the electronic device, but also a structure that takes aesthetics and functionality into consideration is required to meet design needs of users and appropriately cover the camera module which is larger than in the past.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide an electronic device capable of securing waterproof performance while providing a new exterior design.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing which forms an accommodation space, a front cover coupled to one side of the housing, a back cover coupled to the housing at an opposite side of the front cover, and a camera device disposed in one area of the accommodation space, wherein the back cover includes a plate which covers the other area of the accommodation space and a camera cover which covers the camera device, the camera cover having a first edge coupled to the housing and a second edge coupled to the plate.

Advantageous Effects

According to various embodiments of the disclosure, since a back cover of an electronic device includes a camera cover having a pleasing exterior and a structure that facilitates attaching a sealing member, it is possible to secure sufficient waterproof performance while providing a new design.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODES OF THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
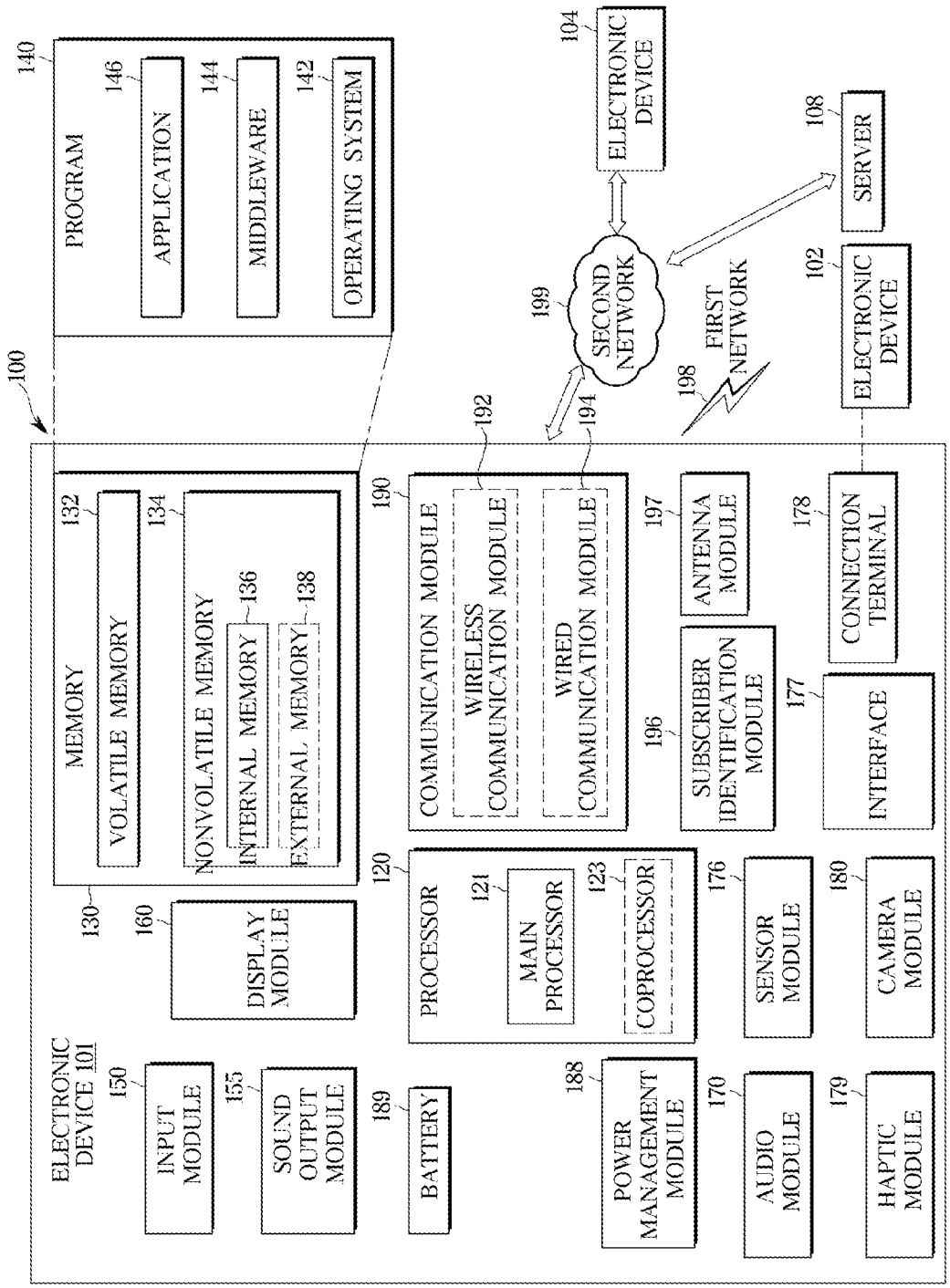
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, in a network environment 100, an electronic device 101 may communicate with an external electronic device 102 through a first network 198 (e.g., a short-range wireless communication network) or may communicate with at least one of an external electronic device 104 and a server 108 through a second network 199 (e.g., a long-range wireless communication network). According to an embodiment, the electronic device 101 may communicate with the external electronic device 104 through the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module 196, and/or an antenna module 197. In a certain embodiment, in the electronic device 101, at least one (e.g., the connection terminal 178) of the above components may be omitted, or one or more other components may be added. In a certain embodiment, some (e.g., the sensor module 176, the camera module 180, and/or the antenna module 197) of the above components may be integrated into a single component (e.g., the display module 160).

For example, the processor 120 may execute software (e.g., a program 140) to control at least one other component (e.g., hardware or software component) connected to the processor 120 or may perform data processing or arithmetic operation in various ways. According to an embodiment, as part of data processing or arithmetic operation, the processor 120 may store a command or data received from another component (e.g., the sensor module 176 or the communication module 190) in a volatile memory 132, process the command or data stored in the volatile memory 132, and store result data in a nonvolatile memory 134. According to an embodiment, the processor 120 may include a main processor 121 (e.g., a central processing unit or an application processor) and/or a coprocessor 123 (e.g., a graphic processing unit, a neural processing unit (NPU), an image signal processor, a sensor hub processor, or a communication processor) that is able to be operated independently of the main processor 121 or together with the main processor 121. For example, in the case in which the electronic device 101 includes the main processor 121 and the coprocessor 123, the coprocessor 123 may be set to use less power than the main processor 121 or set to be specialized for a designated function. The coprocessor 123 may be implemented to be separate from the main processor 121 or implemented to be a portion thereof.

For example, in place of the main processor 121 while the main processor 121 is in an inactive (e.g., sleep) state or together with the main processor 121 while the main processor 121 is in an active (e.g., application running) state, the coprocessor 123 may control at least some of functions or states related to at least one (e.g., the display module 160, the sensor module 176, or the communication module 190) of the components of the electronic device 101. According to an embodiment, the coprocessor 123 (e.g., an image signal processor or a communication processor) may be implemented as part of another functionally-related component (e.g., the camera module 180 or the communication module 190). According to an embodiment, the coprocessor 123 (e.g., an NPU) may include a hardware structure specialized for processing an artificial intelligence model. The artificial intelligence model may be generated through machine learning. For example, the learning may be performed by the electronic device 101 itself in which the artificial intelligence model is executed or may be performed through a separate server (e.g., the server 108). Examples of a learning algorithm may include supervised learning, unsupervised learning, semi-supervised learning, or reinforcement learning, but the learning algorithm is not limited to such examples. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but the artificial neural network is not limited to such examples. The artificial intelligence model may include a software structure in addition to or in place of the hardware structure.

The memory 130 may store various pieces of data used by at least one component (e.g., the processor 120 or the sensor module 176) of the electronic device 101. For example, the data may include software (e.g., the program 140) and input data or output data relating to commands related to the software. The memory 130 may include the volatile memory 132 or the nonvolatile memory 134.

The program 140 may be stored as software in the memory 130 and, for example, may include an operating system 142, middleware 144, or an application 146.

The input module 150 may receive a command or data which will be used in a component (e.g., the processor 120)

of the electronic device 10 from outside the electronic device 101 (e.g., from a user). Examples of the input module 150 may include a microphone, a mouse, a keyboard, a key (e.g., a button), or a digital pen (e.g., a stylus pen).

The sound output module 155 may output a sound signal to the outside of the electronic device 101. For example, the sound output module 155 may include a speaker or a receiver. The speaker may be used for general purposes such as multimedia playback or transcription playback. The receiver may be used to receive incoming calls. According to an embodiment, the receiver may be implemented to be separate from the speaker or implemented to be a portion thereof.

The display module 160 may visually provide information to the outside of the electronic device 101 (e.g., to the user). For example, the display module 160 may include a display, a hologram device, or a projector and a control circuit for controlling the corresponding device. According to an embodiment, the display module 160 may include a touch sensor set to detect a touch or a pressure sensor set to measure the strength of a force generated due to the touch.

The audio module 170 may convert sound into an electrical signal or, conversely, convert an electrical signal into sound. According to an embodiment, the audio module 170 may obtain sound through the input module 150 or may output sound through the sound output module 155 or an external electronic device (e.g., the external electronic device 102) (e.g., a speaker or a headphone) that is connected to the electronic device 101 directly or wirelessly.

The sensor module 176 may detect an operational state (e.g., power or temperature) of the electronic device 101 or an external environment state (e.g., a state of the user) and may generate an electrical signal or a data value that corresponds to the detected state. According to an embodiment, for example, the sensor module 176 may include a gesture sensor, a gyro sensor, an air pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more designated protocols that may be used to directly or wirelessly connect the electronic device 101 to an external electronic device (e.g., the external electronic device 102). According to an embodiment, for example, the interface 177 may include a high definition multimedia interface (HDMI), a universal serial bus (USB) interface, a secure digital (SD) card interface, or an audio interface.

The connection terminal 178 may include a connector through which the electronic device 101 may be physically connected to an external electronic device (e.g., the external electronic device 102). According to an embodiment, for example, the connection terminal 178 may include an HDMI connector, a USB connector, an SD card connector, or an audio connector (e.g., a headphone connector).

The haptic module 179 may convert an electrical signal into mechanical stimulation (e.g., vibration or movement) or electrical stimulation that may be recognized by the user through his or her sense of touch or motion. According to an embodiment, for example, the haptic module 179 may include a motor, a piezoelectric component, or an electrical stimulation device.

The camera module 180 may capture a still image and a moving image. According to an embodiment, the camera module 180 may include one or more lenses, image sensors, image signal processors, or flashes.

The power management module 188 may manage power supplied to the electronic device 101. According to an embodiment, for example, the power management module 188 may be implemented as at least a portion of a power management integrated circuit (PMIC).

The battery 189 may supply power to at least one component of the electronic device 101. According to an embodiment, for example, the battery 189 may include a non-rechargeable primary battery, a rechargeable secondary battery, or a fuel cell.

The communication module 190 may support establishing a direct (e.g., wired) communication channel or wireless communication channel between the electronic device 101 and an external electronic device (e.g., the external electronic device 102, the external electronic device 104, or the server 108) and performing communication through the established communication channel. The communication module 190 may include one or more communication processors that are operated independently of the processor 120 (e.g., an application processor) and support direct (e.g., wired) communication or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication module). Among these communication modules, the corresponding communication module may communicate with the external electronic device 104 through the first network 198 (e.g., a short-range communication network such as Bluetooth, Wi-Fi direct, or infrared data association (IrDA)) or the second network 199 (e.g., a long-range communication network such as a legacy cellular network, a fifth generation (5G) network, a next-generation communication network, the Internet, or a computing network (e.g., an LAN or a wide area network (WAN)). These different types of communication modules may be integrated into a single component (e.g., a single chip) or implemented as a plurality of components (e.g., a plurality of chips) that are separate from each other. Using subscriber information (e.g., international mobile subscriber identifier (IMSI)) that is stored in the subscriber identification module 196, the wireless communication module 192 may verify or authenticate the electronic device 101 in a communication network such as the first network 198 or the second network 199.

The wireless communication module 192 may support the 5G network, which has been launched after the fourth generation (4G) network, and next-generation communication technology, e.g., new radio (NR) access technology. The NR access technology may support high-speed transmission of high-capacity data (enhanced mobile broadband (eMBB)), minimization of power consumption of terminals and access of multiple terminals (massive machine type communications (mMTC)), or ultra-reliable and low-latency communications (URLLC). For example, the wireless communication module 192 may support a high frequency band (e.g., a mmWave band) to achieve a high data transmission rate. The wireless communication module 192 may support various technologies for securing performance in the high frequency band, e.g., technologies such as beamforming, massive multiple-input and multiple-output (MIMO), full dimensional MIMO (FD-MIMO), array antenna, analog beamforming, or large-scale antenna. The wireless communication module 192 may support various requirements specified in the electronic device 101, an external electronic device (e.g., the external electronic device 104), or a network system (e.g., the second network 199). According to an embodiment, the wireless communication module 192 may support a peak data rate (e.g., 20 Gbps or more) for realizing eMBB, loss coverage (e.g., 164 dB or less) for realizing mMTC, or U-plane latency (e.g., 0.5 ms or less for each of a downlink (DL) and an uplink (UL) or 1 ms or less for the round trip) for realizing URLLC.

The antenna module 197 may transmit a signal or power to the outside (e.g., an external electronic device) or receive a signal or power from the outside. According to an embodiment, the antenna module 197 may include an antenna including a conductor formed on a substrate (e.g., a printed circuit board (PCB)) or an emitter made of a conductive pattern. According to an embodiment, the antenna module 197 may include a plurality of antennas (e.g., an array antenna). In this case, for example, at least one antenna suitable for a communication method used in a communication network such as the first network 198 or the second network 199 may be selected from the plurality of antennas by the communication module 190. A signal or power may be transmitted or received between the communication module 190 and an external electronic device through the selected at least one antenna. According to a certain embodiment, in addition to the emitter, another part (e.g., a radio frequency integrated circuit (RFIC)) may be formed as a portion of the antenna module 197.

According to various embodiments, the antenna module 197 may form a mmWave antenna module. According to an embodiment, the mmWave antenna module may include a PCB, an RFIC which is disposed on or in the vicinity of a first surface (e.g., a lower surface) of the PCB and configured to support a designated high frequency band (e.g., the mmWave band), and a plurality of antennas (e.g., an array antenna) which are disposed on or in the vicinity of a second surface (e.g., an upper surface or a side surface) of the PCB and configured to transmit or receive a signal in the designated high frequency band.

At least some of the above components may be connected to each other and exchange signals (e.g., commands or data) through a communication method (e.g., a bus, general purpose input and output (GPIO), serial peripheral interface (SPI), or mobile industry processor interface (MIPI)) between nearby devices.

According to an embodiment, commands or data may be transmitted or received between the electronic device 101 and the external electronic device 104 through the server 108 connected to the second network 199. Each of the external electronic devices 102 and 104 may be the same type of device as the electronic device 101 or a different type of device therefrom. According to an embodiment, all or some of the operations executed in the electronic device 101 may be executed in one or more external electronic devices of the external electronic devices 102 and 104 and the server 108. For example, in a case in which the electronic device 101 should perform a certain function or service automatically or in response to a request from a user or another device, the electronic device 101 may, instead of or in addition to executing the function or service by itself, request one or more external electronic devices to perform at least a part of the function or service. The one or more external electronic devices that have received the request may execute at least a part of the requested function or service or an additional function or service relating to the request and deliver a result of the execution to the electronic device 101. The electronic device 101 may provide the result as at least a part of a response to the request without changing the result or after additionally processing the result. To this end, for example, cloud computing, distributed computing, mobile edge computing (MEC), or client-server computing technology may be used. For example, the electronic device 101 may provide ultra-low-latency service using distributed computing or MEC. In another embodiment, the external electronic device 104 may include an Internet-of-Things (IoT) device. The server 108 may be an intelligent server using machine learning and/or a neural network. According to an embodiment, the external electronic device 104 or the server 108 may be included within the second network 199. The electronic device 101 may be applied to intelligent service (e.g., Smart Home, Smart City, Smart Car, or Healthcare) on the basis of 5G communication technology and IoT-related technology.

An electronic device according to various embodiments that is disclosed in this document may be a device of various forms. Examples of the electronic device may include a portable communication device (e.g., a smartphone), a computer device, a portable multimedia device, a portable medical device, a camera, a wearable device, and a home appliance. The electronic device according to an embodiment of this document is not limited to the above-mentioned devices.

Various embodiments of this document and terms used herein are not intended to limit technical features described in this document to specific embodiments and should be understood as including various changes, equivalents, or substitutes of the corresponding embodiment. In relation to description of the drawings, like reference numerals may be used for like or related components. A singular form of a noun corresponding to an item may include one or more of the items unless the relevant context clearly indicates otherwise. In this document, phrases such as "A or B," "at least one of A and B," "at least one of A or B," "A, B, or C," "at least one of A, B, and C," and "at least one of A, B, or C" may each include any one of items listed together in the corresponding phrase among the phrases or include any possible combination thereof. Terms such as "first" and "second" may be simply used to distinguish the corresponding component from another component and do not limit the corresponding components in terms of other aspects (e.g., importance or order). When a certain (e.g., first) component is mentioned as being "coupled" or "connected" to another (e.g., second) component with or without use of the term "functionally" or "communicatively," this indicates that the certain component may be connected to the other component directly (e.g., via a wire), wirelessly, or through a third component.

The term "module" used in various embodiments of the disclosure may include a unit implemented using hardware, software, or firmware and, for example, may be interchangeably used with terms such as "logic," "logic block," "part," or "circuit." A module may be an integrally configured part or a minimum unit or portion of the part that performs one or more functions. For example, according to an embodiment, a module may be implemented in the form of an application-specific integrated circuit (ASIC).

Various embodiments of this document may be implemented as software (e.g., the program 140) that includes one or more instructions stored in a storage medium (e.g., an internal memory 136 or an external memory 138) that is readable by a machine (e.g., the electronic device 101). For example, a processor (e.g., the processor 120) of a machine (e.g., the electronic device 101) may, from the storage medium, call at least one of the one or more instructions stored therein and execute the command. This allows the machine to be operated to perform at least one function according to the called at least one instruction. The one or more instructions may include a code generated by a compiler or a code that may be executed by an interpreter. The machine-readable storage medium may be provided in the form of a non-transitory storage medium. Here, the term "non-transitory" only indicates that the storage medium is a tangible device and does not include signals (e.g., electromagnetic waves), and the term does not differentiate between a case in which data is semi-permanently stored in a storage medium and a case in which data is temporarily stored in a storage medium.

According to an embodiment, a method according to various embodiments that is disclosed in this document may be provided by being included in a computer program product. The computer program product may be traded as a commodity between a seller and a buyer. The computer program product may be distributed in the form of a machine-readable storage medium (e.g., a compact disc read-only memory (CD-ROM)) or may be distributed online directly (e.g., downloaded or uploaded) through an application store (e.g., the Play Store®) or between two user devices (e.g., smartphones). In the case of online distribution, at least a portion of the computer program product may be at least temporarily stored in a machine-readable storage medium such as a server of a manufacturer, a server of an application store, or a memory of a relay server or may be temporarily generated.

According to various embodiments, each component (e.g., a module or program) of the above-described components may include a single entity or a plurality of entities, and some of the plurality of entities may be separately disposed in another component. According to various embodiments, one or more components or operations may be omitted from the above-described corresponding components or one or more other components or operations may be added thereto. Alternatively or additionally, a plurality of components (e.g., modules or programs) may be integrated into a single component. In this case, the integrated component may perform one or more functions of each of the plurality of components in the same or a similar way as when performed by the corresponding component among the plurality of components before the integration. According to various embodiments, operations performed by a module, a program, or another component may be executed sequentially, in parallel, repeatedly, or heuristically, one or more of the operations may be executed in a different order or omitted, or one or more other operations may be added.

Figure 2:
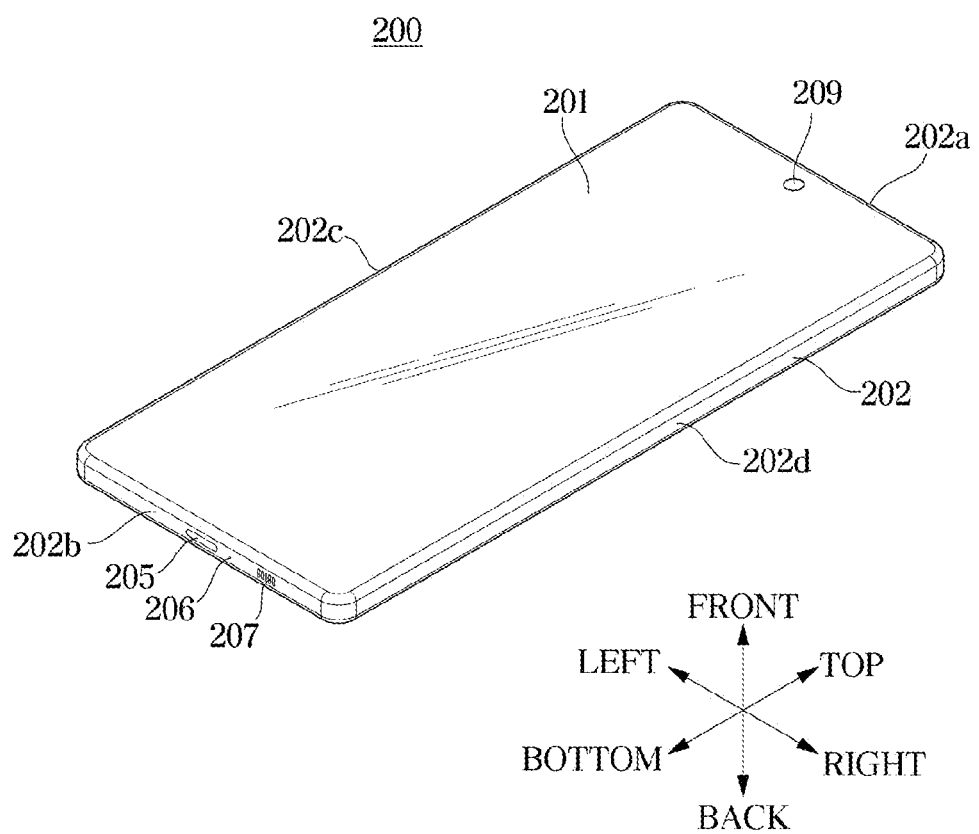
FIG. 2 is a view illustrating a front of an electronic device according to an embodiment of the disclosure.
Figure 3:
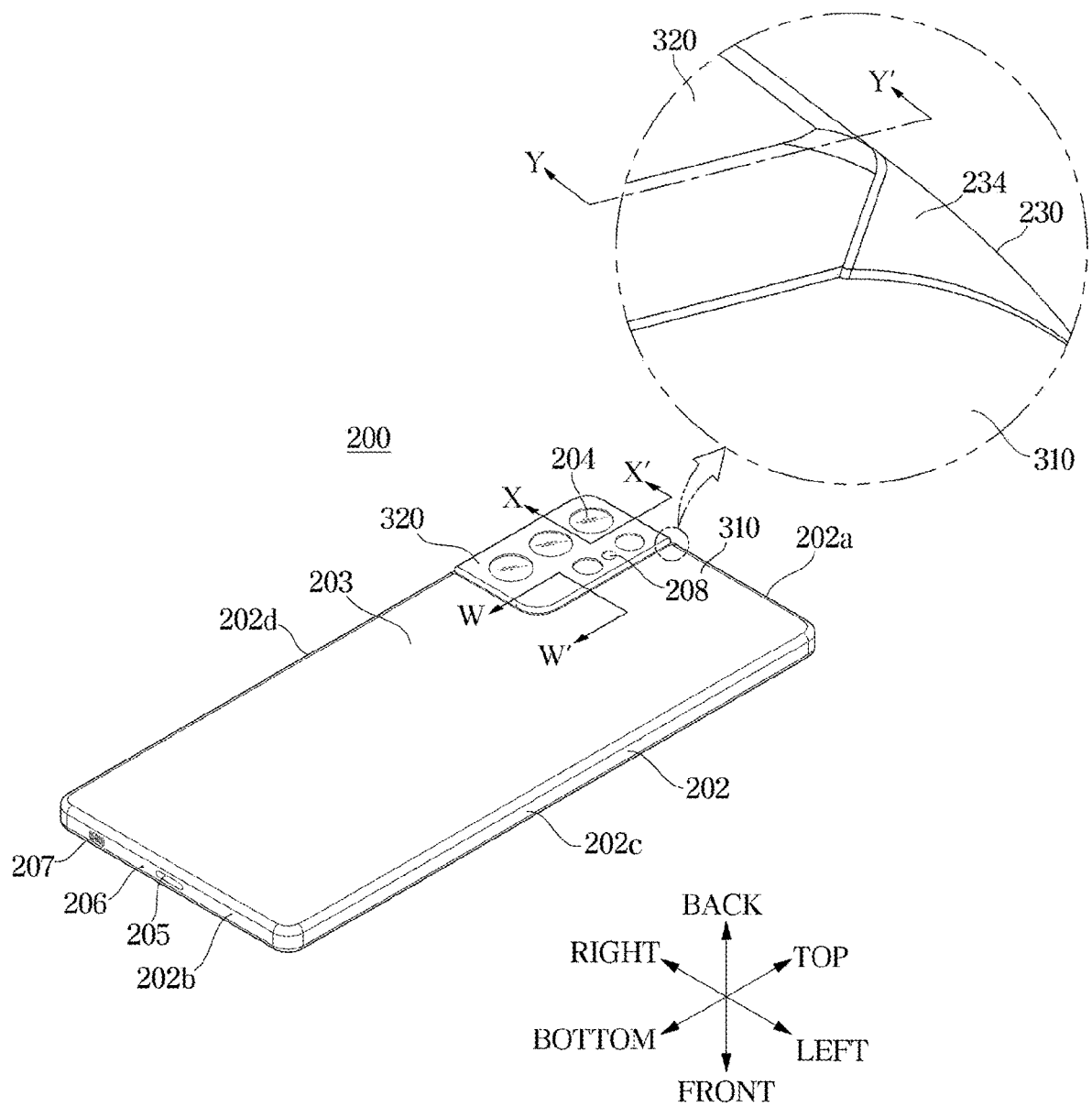
FIG. 3 is a view illustrating a back of an electronic device according to an embodiment of the disclosure.
Figure 4:
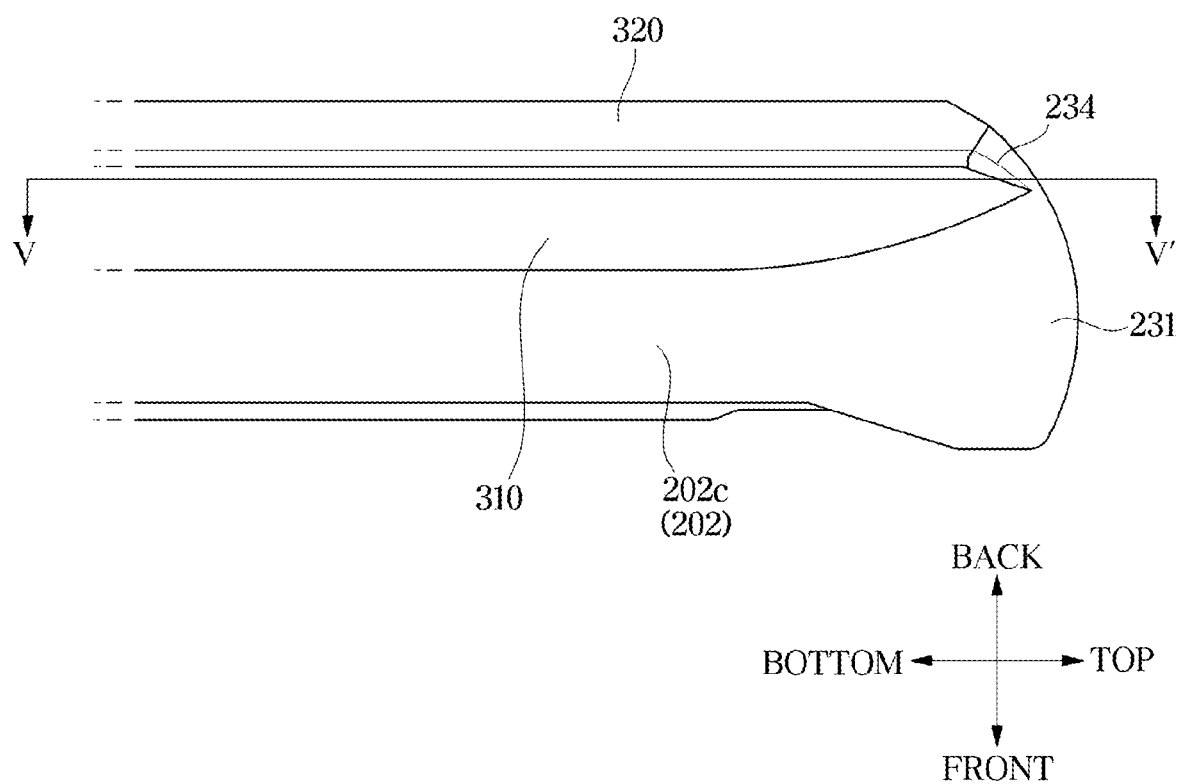
FIG. 4 is a view of an electronic device from one side according to an embodiment of the disclosure.
Figure 5:
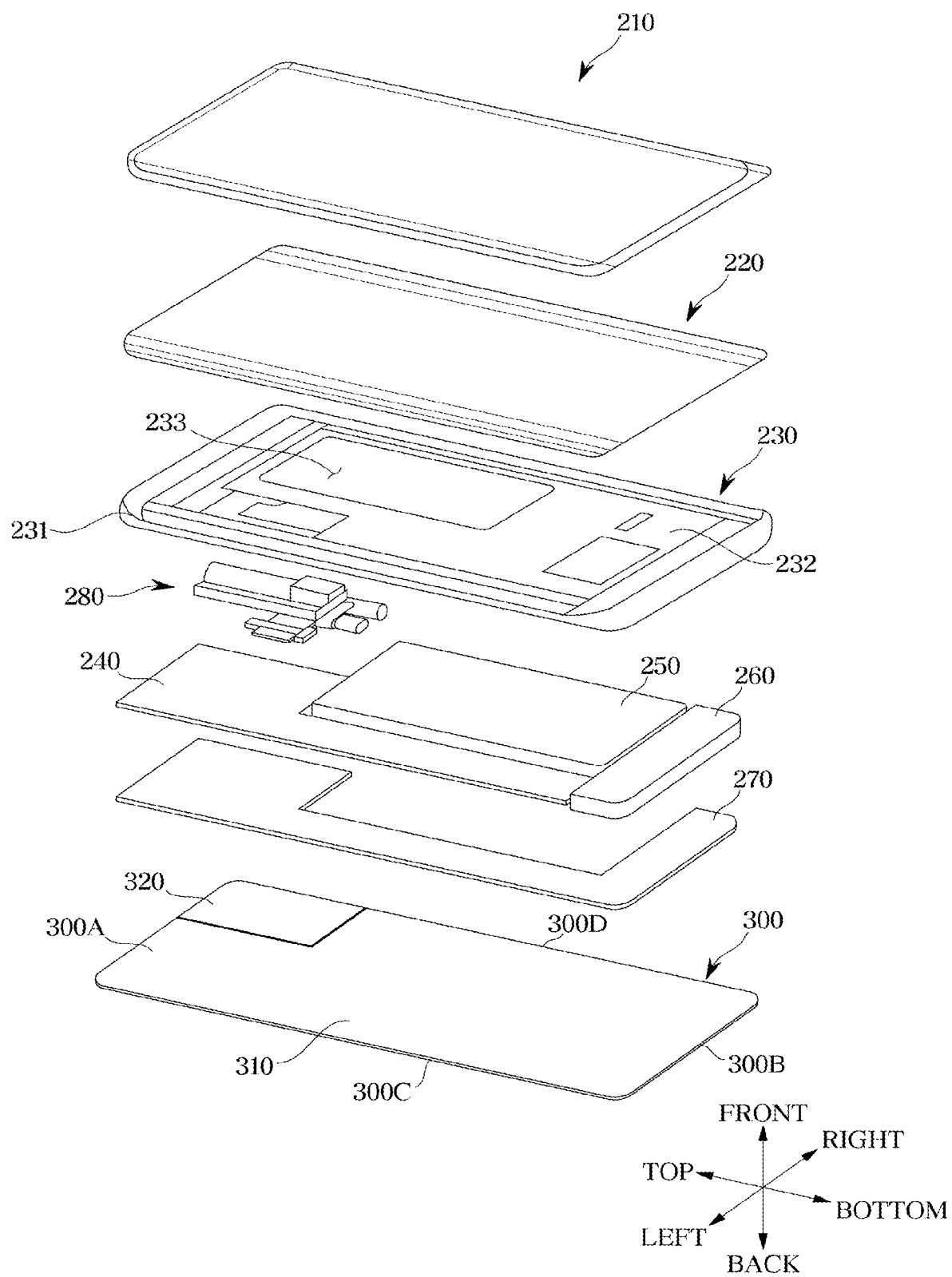
FIG. 5 is an exploded perspective view of an electronic device according to an embodiment of the disclosure.

FIG. 2 is a view illustrating a front of an electronic device according to an embodiment of the disclosure. FIG. 3 is a view illustrating a back of an electronic device according to an embodiment of the disclosure. FIG. 4 is a view of an electronic device from one side according to an embodiment of the disclosure. FIG. 5 is an exploded perspective view of an electronic device according to an embodiment of the disclosure.

Referring to FIGS. 2 to 5, an electronic device 200 (e.g., the electronic device 101 of FIG. 1) according to various embodiments may include a main body, a display 220, a PCB 240, a battery 250, a connector hole 205, audio modules (e.g., microphone hole 206, speaker hole 207, and speaker 260), and camera modules 204, 208, 209, and 280. In various embodiments, at least one of the above-described components may be omitted from the electronic device 200, or the electronic device 200 may further include another component.

The main body may form an exterior of the electronic device 200 and may include a first surface 201, a second surface 203, and side surfaces 202 that surround a space between the first surface 201 and the second surface 203. The first surface 201 may correspond to a front surface of the electronic device 200, the second surface 203 may correspond to a back surface of the electronic device 200, and the side surfaces 202 may correspond to upper, lower, left, and right surfaces 202a, 202b, 202c, and 202d of the electronic device 200 when viewed from the front surface of the electronic device 200. According to another embodiment (not illustrated), the main body may also refer to a structure that forms some of the first surface 201, the second surface 203, and the side surfaces 202.

According to various embodiments, the main body may include a front plate 210 (or "front cover") (e.g., a glass plate or polymer plate including various coating layers) of which at least a portion is substantially transparent, and the first surface 201 may be formed by the front plate 210 that faces a first direction (or the front). The main body may include a back plate 300 (or "back cover") which is substantially opaque, and the second surface 203 may be formed by the back plate 300 that faces a second direction (or the back). For example, the back plate 300 may be formed using coated or tinted glass, a ceramic, a polymer, a metal (e.g., aluminum, stainless steel (STS), or magnesium), or a combination of at least two or more thereof. The main body may include a housing 230 coupled to the front plate 210 and the back plate 300, and the side surfaces 202 may be formed by the housing 230.

According to various embodiments, the back plate 300 may have an upper end edge 300A, a lower end edge 300B, a left side end edge 300C, and a right side end edge 300D coupled to the housing 230 (e.g., a first support member 232 and/or a side member 231).

The housing 230 may include a side bezel structure (or "side member 231") which is coupled to the front plate 210 and the back plate 300, includes a metal and/or a polymer, and forms the side surfaces 202. According to a certain embodiment, an edge portion of the front plate 210 and/or an edge portion of the back plate 300 may also form the side surfaces 202 of the electronic device 200 together with the side bezel structure (i.e., side member 231). A space formed due to being surrounded by the side member 231 of the housing 230 may be referred to as an accommodation space 233. Since the accommodation space 233 may be covered by the front plate 210 and the back plate 300, the accommodation space 233 may be understood as a space formed due to the front plate 210, the back plate 300, and the side member 231 being coupled and/or attached.

The display 220, the PCB 240, the battery 250, the audio modules (e.g., microphone hole 206, speaker hole 207, and speaker 260), an antenna (not illustrated), and the camera modules 204, 208, 209, and 280 may be accommodated in the accommodation space 233. The display 220, the PCB 240, the battery 250, the audio modules (e.g., microphone hole 206, speaker hole 207, and speaker 260), the antenna, and the camera modules 204, 208, 209, and 280 may be disposed in association with one other to correspond to the shapes of one another so that overlapping with one another is avoided or minimized.

For example, the display 220 may be exposed through a substantial portion of the front plate 210. The display 220 may be a concept that encompasses configurations such as a touch sensor that detects a touch signal input through the front plate 210, a plurality of optical layers that receive power and emit light or adjust a wavelength of light under control of a display driver integrated circuit (IC), a polarizing plate that prevents diffused reflection of light generated from the display or diffusion of the light in an unintended direction, and a cover panel. In a certain embodiment, corners of the display 220 may be formed to have a shape that is substantially the same as the shape of an outer boundary of the front plate 210 that is adjacent to the corners of the display 220.

In various embodiments, the housing 230 may include the first support member 232 and/or a second support member 270. The first support member 232 may be connected (or coupled) to the side member 231 or integrally formed with the side member 231. The first support member 232 may protrude from the side member 231 to the accommodation space 233. For example, the first support member 232 may be made of a metal material and/or a nonmetal (e.g., polymer) material. The display 220 may be disposed (or coupled) on one surface of the first support member 232 that faces the first direction (or the front), and the PCB 240 may be disposed (or coupled) on the other surface of the first support member 232 that faces the second direction (or the back). The second support member 270 may be disposed at the back of the PCB 240 to support at least a portion of the PCB 240. The first support member 232 or the second support member 270 may also be omitted. In various embodiments, at least one sensor that detects various pieces of information may be disposed in a space formed due to coupling of the display 220, the one surface of the first support member 232, and the side member 231.

A processor, a memory, and/or an interface may be mounted on the PCB 240. For example, the processor may include one or more of a central processing unit, an application processor, a graphic processing unit, an image signal processor, a sensor hub processor, and a communication processor. For example, the memory may include a volatile memory or a nonvolatile memory. For example, the interface may include an HDMI, a USB interface, an SD card interface, and/or an audio interface. For example, the interface may connect the electronic device to an external electronic device electrically or physically and may include a USB connector, an SD card/multimedia card (MMC) connector, or an audio connector. At least one of the display, battery, audio modules, and camera modules may be electrically connected to the PCB through at least one of a conductive line, a flexible board, and a connector.

The antenna may be disposed between the back plate 300 and the battery 250. For example, the antenna according to an embodiment may include a near-field communication antenna, a wireless charging antenna, and/or a magnetic secure transmission (MST) antenna. For example, the antenna may perform near-field communication with an external device or wirelessly transmit or receive power necessary for charging. In another embodiment, an antenna structure may be formed by portions of the side member 231 and/or the first support member 232 or a combination thereof.

The connector hole 205 may include the connector hole 205 which is able to accommodate a connector (e.g., a USB connector) for transmitting and receiving power and/or data to and from an external electronic device.

The audio modules may include a microphone hole 206 and a speaker hole 207. A microphone for obtaining external sound may be disposed inside the microphone hole 206, and in a certain embodiment, a plurality of microphones may be disposed therein to detect a direction of sound. The speaker hole 207 may be provided to emit sound of a speaker 260. The speaker hole 207 may include an external speaker hole and a call receiver hole. According to a certain embodiment, the speaker hole 207 and the microphone hole 206 may be implemented as a single hole, or a speaker (e.g., a piezo speaker) may be included without a speaker hole.

The camera modules 204, 208, 209, and 280 may include a front camera device (e.g., camera module 209) disposed at an upper end of the first surface 201 of the electronic device 200, back camera modules 204 and 280 disposed on the second surface 203, and/or a flash (e.g., camera module 208). The camera modules 204, 209, and 280 may include one or more lenses, an image sensor, and/or an image signal processor. For example, the flash may include a light emitting diode or a xenon lamp. According to a certain embodiment, two or more lenses (an infrared camera, a wide-angle lens, and a telephoto lens) and image sensors may be disposed on one surface of the electronic device.

Figure 6:
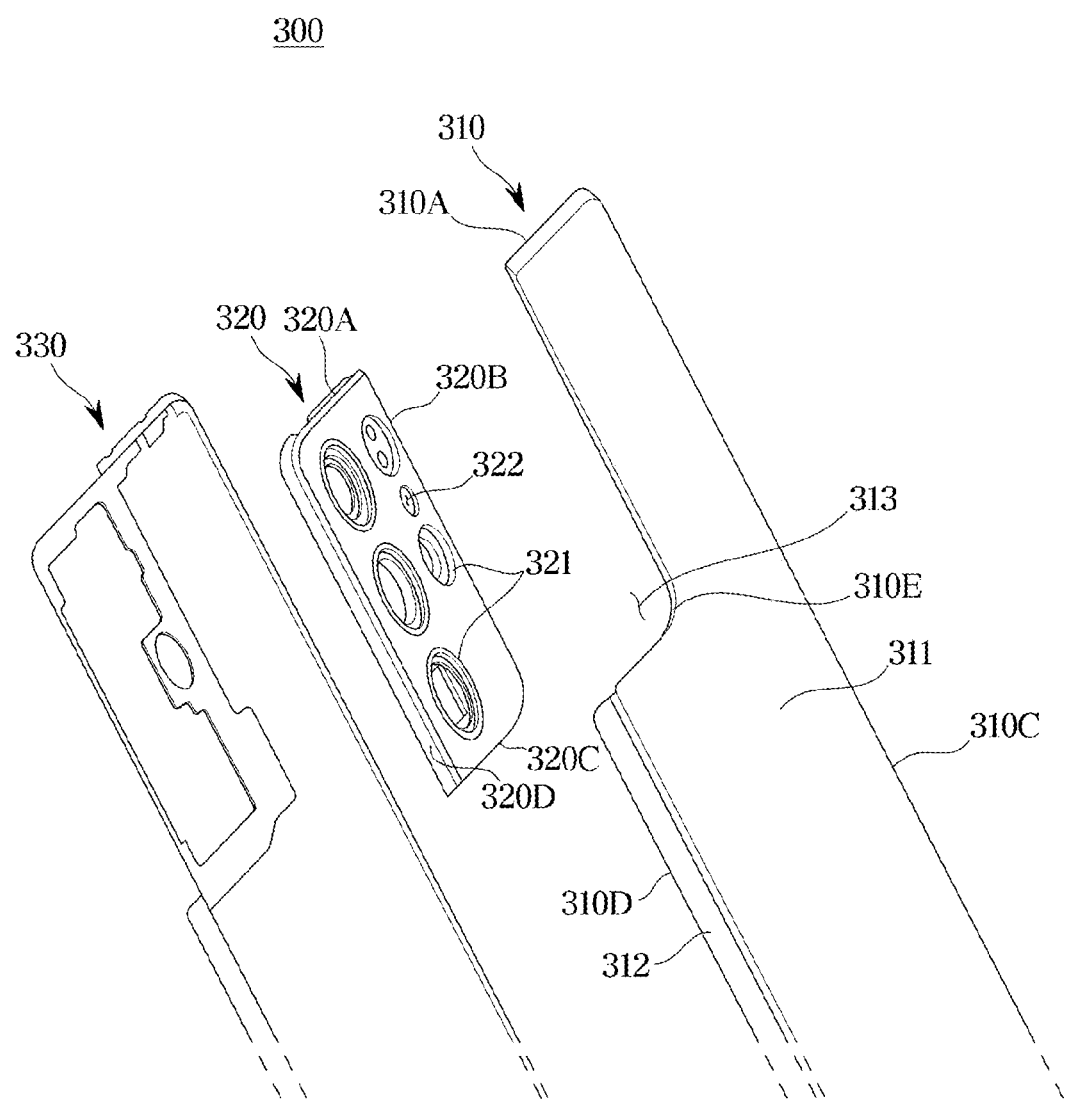
FIG. 6 is an exploded view of a back cover of an electronic device according to an embodiment of the disclosure.

FIG. 6 is an exploded view of a back cover of an electronic device according to an embodiment of the disclosure.

Referring to FIG. 6, in an embodiment, a back plate 300 may include a plate 310, a camera cover 320, and a sealing member 330. The camera cover 320 may be coupled to the plate 310, and as the sealing member 330 is attached to one surface of the plate 310 and the camera cover 320 in a state in which the plate 310 and the camera cover 320 are coupled, the back plate 300 may be manufactured or assembled.

According to various embodiments, a back camera device (i.e., the back camera module 280) (hereinafter referred to as "camera module 280") may be disposed in a right side upper end area of the accommodation space 233 when the accommodation space 233 is viewed from the front, and the plate 310 may have an opening 313 formed at a position corresponding to the camera module 280 so that the camera module 280 is exposed. In other words, the plate 310 may cover areas of the accommodation space 233 except for the right side upper end area of the accommodation space 233 in which the camera module 280 is disposed. However, the disclosure is not limited thereto, and the camera module 280 may be disposed in a left side upper end area, a right side lower end area, or a left side lower end area of the accommodation space 233 when the accommodation space 233 is viewed from the front, and the opening 313 may be formed at a position corresponding to the camera module 280.

The plate 310 may include an upper end edge 310A, a lower end edge, a left side end edge 310C, a right side end edge 310D, and a corner portion 310E. In an embodiment, the lower end edge of the plate 310 may be the same as the lower end edge 300B of the back cover. The upper end edge 310A of the plate 310 and the lower end edge 300B of the plate 310 may extend in the left-right direction, and the left side end edge 310C and the right side end edge 310D may extend in the top-bottom direction. The left side end edge 310C and the right side end edge 310D may have different lengths, and one end of the left side end edge 310C and one end of the right side end edge 310D may each be connected to the lower end edge 300B. One end of the upper end edge 310A may be connected to a longer edge of the left side end edge 310C and the right side end edge 310D, and the upper end edge 310A may have a length shorter than that of the lower end edge 300B. According to an embodiment, the right side end edge 310D of the plate 310 may have a length shorter than that of the left side end edge 310C.

The corner portion 310E that is concavely formed in an L-shape substantially toward the center of the plate 310 may form the opening 313 while connecting the other end of the upper end edge 310A and one end of a shorter edge of the left side end edge 310C and the right side end edge 310D.

According to an embodiment, one end of the corner portion 310E may be connected to an upper end of the right side end edge 310D, and the other end of the corner portion 310E may be connected to a right side end of the upper end edge 310A.

However, the disclosure is not limited thereto. According to another embodiment, the left side end edge 310C and the right side end edge 310D may have different lengths, and one end of the left side end edge 310C and one end of the right side end edge 310D may each be connected to the upper end edge 310A. One end of the lower end edge of the plate 310 may be connected to a longer edge of the left side end edge 310C and the right side end edge 310D, and the lower end edge may have a length shorter than that of the upper end edge 310A. The corner portion 310E that is concavely formed in an L-shape substantially toward an inner side of the plate 310 may form the opening 313 while connecting the other end of the lower end edge and one end of a shorter edge of the left side end edge 310C and the right side end edge 310D.

The plate 310 may include a flat surface portion 311 which forms a portion of the back surface (i.e., second surface 203) of the electronic device 200 and is provided to be flat and a bent portion 312 which extends from a left side end and/or a right side end of the flat surface portion 311 and forms a portion of at least one of the side surfaces 202 of the electronic device 200.

The back plate 300 may include the camera cover 320 which closes the opening 313 formed by the plate 310 and covers the camera module 280. The camera cover 320 may be provided in a shape that corresponds to the opening 313.

The camera cover 320 may include at least one camera window 321 which is formed at a position corresponding to a lens and/or an image sensor of the camera module 280 and passes through front and back surfaces of the camera cover 320 and a flash hole 322 which corresponds to the flash (e.g., camera module 208). The at least one camera window 321 and the flash hole 322 may be substantially covered by a transparent cover member (e.g., glass or a polymer including various coating layers).

The camera cover 320 may have one side coupled to the housing 230 and the other side coupled to the plate 310. The camera cover 320 may include first, second, third, and fourth edges 320A, 320B, 320C, and 320D. The first to fourth edges 320A to 320D may be connected to one another. The first edge 320A and the third edge 320C may extend in one direction (e.g., the left-right direction) while being parallel to each other, and the second edge 320B and the fourth edge 320D may extend in the other direction (e.g., the top-bottom direction) while being parallel to each other. Any one of the first and fourth edges 320A and 320D and any one of the second and third edges 320B and 320C may be coupled to the plate 310, and the remaining edges may be coupled to the housing 230.

According to an embodiment, the first edge 320A of the camera cover 320 may be connected to the upper end edge 310A of the plate 310, the fourth edge 320D of the camera cover 320 may be connected to a shorter edge (e.g., the right side end edge 310D) of the left side end edge 310C and the right side end edge 310D of the plate 310, and the second and third edges 320B and 320C of the camera cover 320 may correspond to the corner portion 310E of the plate 310. The first and fourth edges 320A and 320D of the camera cover 320 may be coupled to the housing 230 (e.g., the first support member 232 and/or the side member 231), and the second and third edges 320B and 320C of the camera cover 320 may be coupled to the plate 310 (e.g., the corner portion 310E).

A corner portion where the second edge 320B and the third edge 320C meet may be round to correspond to the corner portion 310E of the plate 310.

Figure 7:
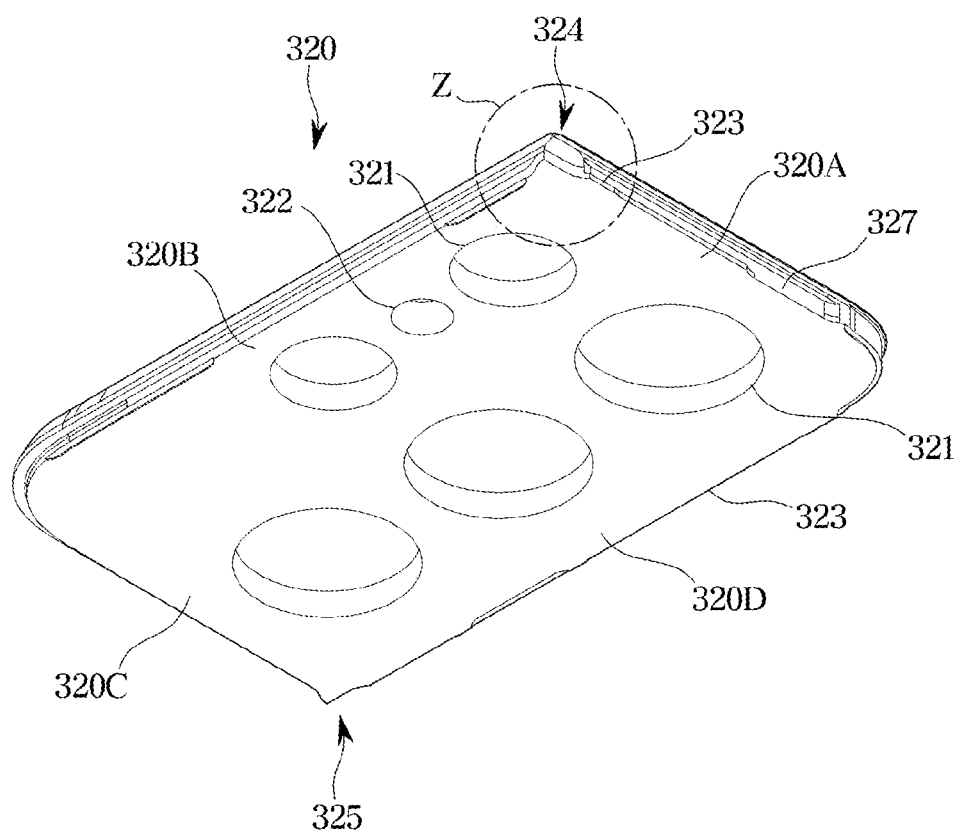
FIG. 7 is a view illustrating a camera cover of an electronic device according to an embodiment of the disclosure.
Figure 8:
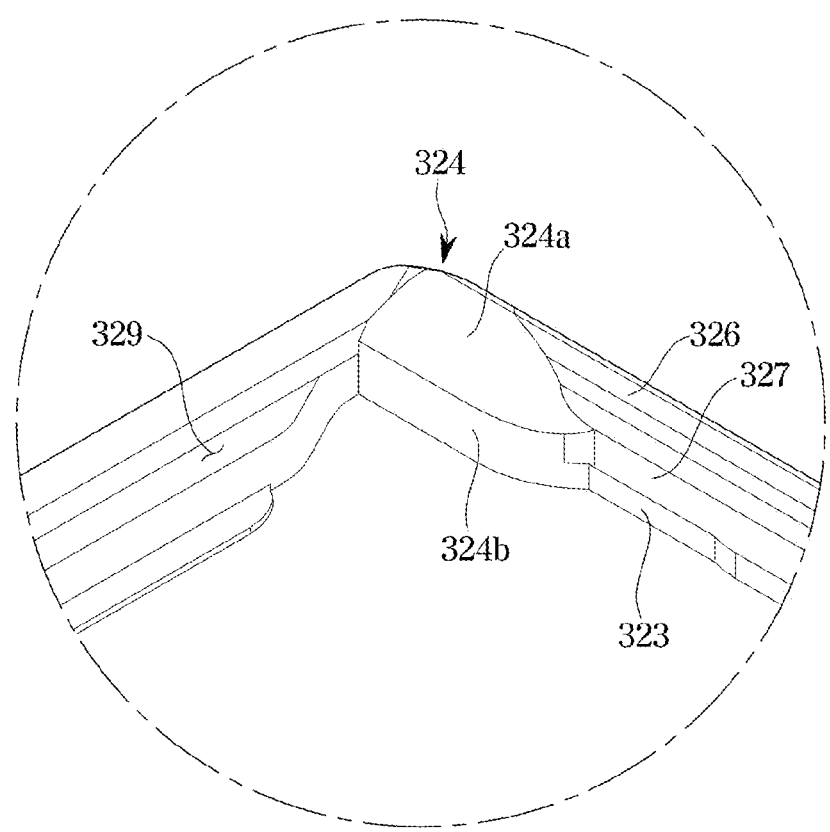
FIG. 8 is an enlarged view of portion Z of FIG. 7 according to an embodiment of the disclosure.
Figure 9:
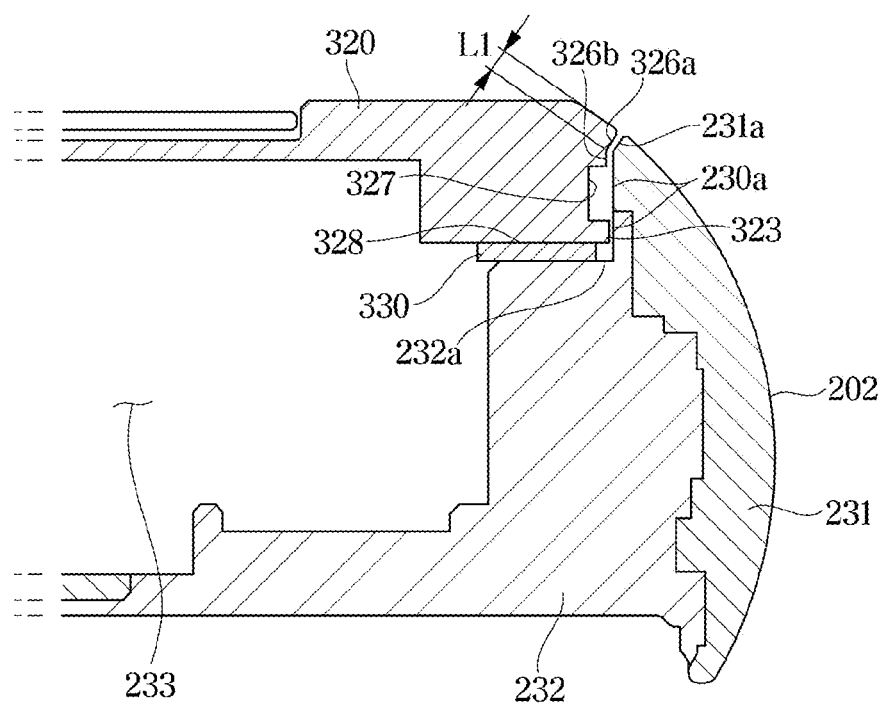
FIG. 9 is a view schematically illustrating a cross-section of an electronic device that is taken along line X-X' of FIG. 3 according to an embodiment of the disclosure.
Figure 9:
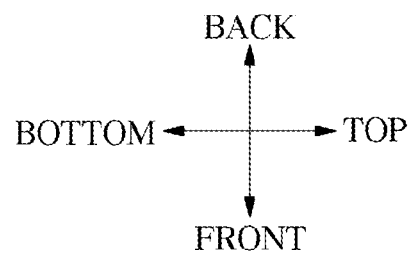
Figure 10:
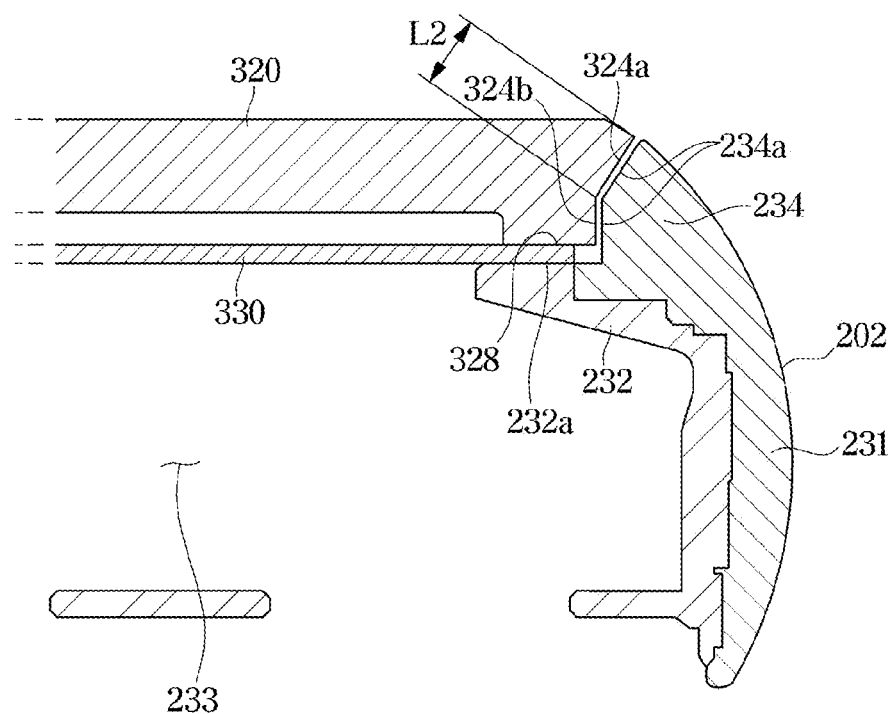
FIG. 10 is a view schematically illustrating a cross-section of an electronic device that is taken along line Y-Y' of FIG. 3 according to an embodiment of the disclosure.
Figure 10:
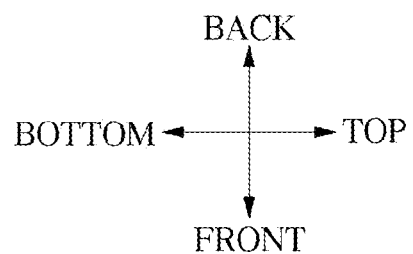

FIG. 7 is a view illustrating a camera cover of an electronic device according to an embodiment of the disclosure. FIG. 8 is an enlarged view of portion Z of FIG. 7 according to an embodiment of the disclosure. FIG. 9 is a view schematically illustrating a cross-section of an electronic device that is taken along line X-X' of FIG. 3 according to an embodiment of the disclosure. FIG. 10 is a view schematically illustrating a cross-section of an electronic device that is taken along line Y-Y' of FIG. 3 according to an embodiment of the disclosure. In the description with reference to the drawings, "contact" may be a concept that encompasses a case where a gap within an allowed range is formed due to assembly tolerance.

Referring to FIGS. 7 to 10, in an embodiment, a camera cover 320 may include a contact surface 326 which is formed along the first and fourth edges 320A and 320D coupled to the housing 230 and comes in contact with the side member 231. The contact surface 326 may come in contact with a back end portion 231a of an inner side surface of the side member 231. The contact surface 326 may include a first inclined portion 326a, which is tilted with respect to a horizontal plane parallel to the back surface (i.e., second surface 203) of the electronic device 200 so as to head toward the center of the camera cover 320 due to extending toward the first support member 232 and a first extending portion 326b, which is connected to one end of the first inclined portion 326a and has a slope different from that of the first inclined portion 326a. In other words, the first inclined portion 326a may approach an adjacent side surface of the side surfaces 202 of the electronic device 200 due to extending from the front to back. According to an embodiment, the first extending portion 326b may extend to be perpendicular to one surface 232a of the first support member 232 (or the horizontal plane parallel to the back surface of the electronic device) which faces the back and to which the camera cover 320 is attached. The back end portion 231a of the inner side surface of the side member 231 may include an inclined surface which corresponds to the first inclined portion 326a of the contact surface 326 and comes in contact with the first inclined portion 326a of the contact surface 326. According to an embodiment, the contact surface 326 may extend along the first edge 320A and the fourth edge 320D.

The camera cover 320 may include first and second machined surfaces 324 and 325 which are formed at one ends of edges as portions of the camera cover 320 are eliminated. The first and second machined surfaces 324 and 325 may include a plurality of machined surfaces. Each of the first and second machined surfaces 324 and 325 may include a second inclined portion 324a, which is tilted with respect to the horizontal plane parallel to the back surface (i.e., second surface 203) of the electronic device 200 so as to head toward the center of the camera cover 320 due to extending toward the first support member 232, and a second extending portion 324b, which is connected to one end of the second inclined portion 324a and has a slope different from that of the second inclined portion 324a. In other words, the second inclined portion 324a may approach an adjacent side surface of side surfaces 202 of the electronic device 200 due to extending from the front to back. According to an embodiment, the second extending portion 324b may extend to be perpendicular to the one surface 232a of the first support member 232 (or the horizontal plane parallel to the back surface of the electronic device) which faces the back and to which the camera cover 320 is attached. The first and second machined surfaces 324 and 325 may be connected to one end of the contact surface 326.

According to an embodiment, the first and second machined surfaces 324 and 325 may include the first machined surface 324 formed at a position where the first edge 320A and the second edge 320B meet and a second machined surface 325 formed at a position where the third edge 320C and the fourth edge 320D meet. In other words, the first machined surface 324 may be formed at one end of the first edge 320A that is connected to the second edge 320B, and the second machined surface 325 may be formed at one end of the fourth edge 320D that is connected to the third edge 320C. The second inclined portion 324a of the first and second machined surfaces 324 and 325 may be connected to the first inclined portion 326a of the contact surface 326. However, the disclosure is not limited thereto. According to a certain embodiment, since the plate 310 may be coupled to the first and second edges 320A and 320B or coupled to the third and fourth edges 320C and 320D, the first machined surface 324 may be formed at a position where the second edge 320B and the third edge 320C meet, and the second machined surface 325 may be formed at a position where the first edge 320A and the fourth edge 320D meet.

Figure 11:
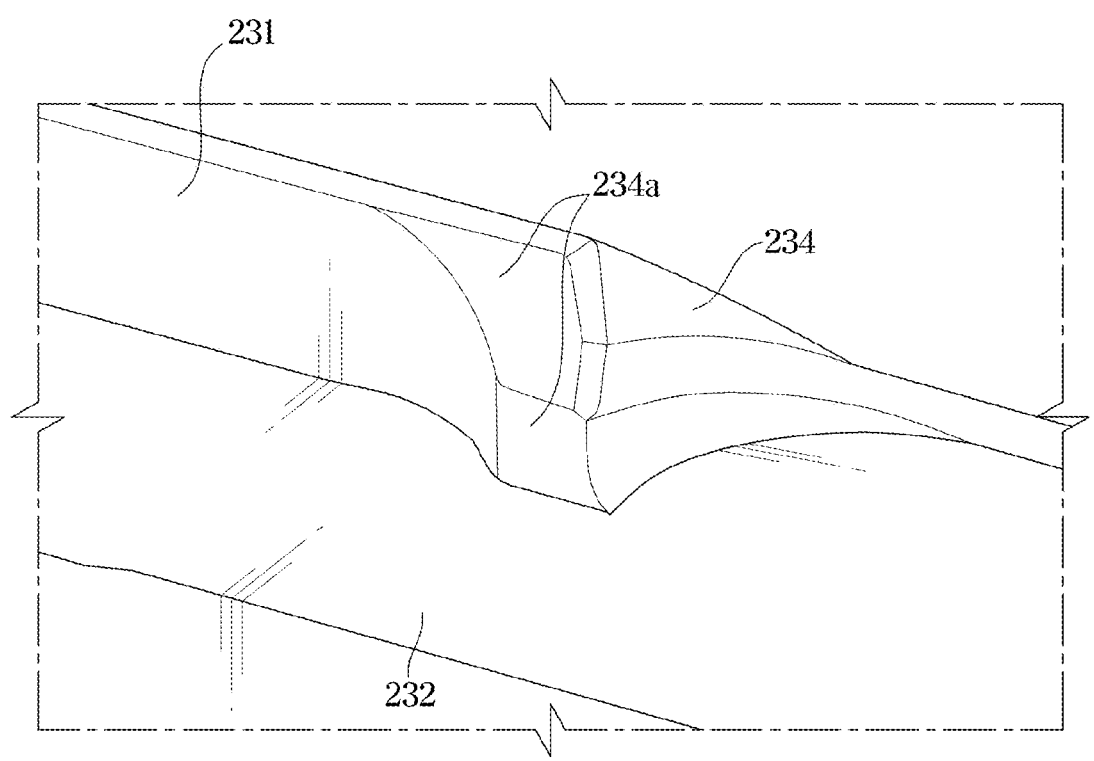
FIG. 11 is a view illustrating a protruding portion of an electronic device according to an embodiment of the disclosure.
Figure 12:
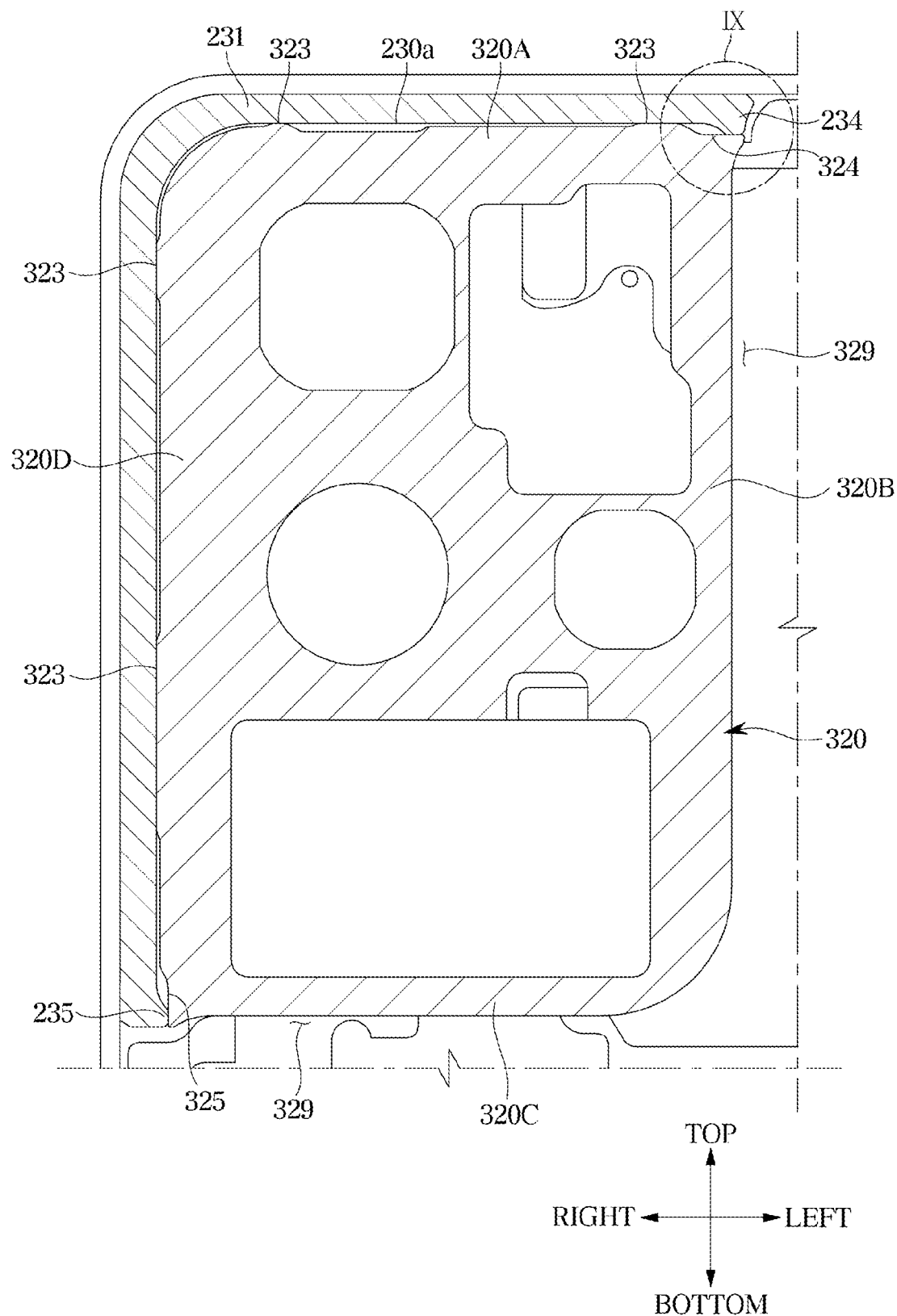
FIG. 12 is a view schematically illustrating a cross-section of an electronic device that is taken along line V-V' of FIG. 4 according to an embodiment of the disclosure.

FIG. 9 is a view schematically illustrating a cross-section of an electronic device that is taken along line X-X' of FIG. 3 according to an embodiment of the disclosure. FIG. 10 is a view schematically illustrating a cross-section of an electronic device that is taken along line Y-Y' of FIG. 3 according to an embodiment of the disclosure. FIG. 11 is a view illustrating a protruding portion of an electronic device according to an embodiment of the disclosure. FIG. 12 is a view schematically illustrating a cross-section of an electronic device that is taken along line V-V of FIG. 4 according to an embodiment of the disclosure. Hereinafter, the first machined surface 324 and a first protruding portion 234 will be mainly described, but the description may also apply to the second machined surface 325 and a second protruding portion 235.

Referring to FIGS. 9 to 12, housing 230 may include the first and second protruding portions 234 and 235 which are formed to protrude from the inner side surface of the side member 231 so as to come in contact with the first and second machined surfaces 324 and 325. The first and second protruding portions 234 and 235 may include a plurality of protruding portions. The first and second protruding portions 234 and 235 may include the first protruding portion 234 which corresponds to the first machined surface 324 and the second protruding portion 235 which corresponds to the second machined surface 325. Since an outer side surface 234a of the first protruding portion 234 is formed to correspond to the first machined surface 324, when the back plate 300 is coupled to the housing 230, at least a portion of the outer side surface 234a of the first protruding portion 234 may come in contact with the first machined surface 324. As the camera cover 320 is coupled to the housing 230, the first protruding portion 234, which is in contact with the first machined surface 324, and one end of the second inclined portion 324a may be exposed to the outside and form an exterior of the electronic device 200.

According to an embodiment, a length L2 of a line of intersection between the second inclined portion 324a of the first machined surface 324 and a plane perpendicular to the direction in which the first edge 320A extends (or the left-right direction) may be longer than a length L1 of a line of intersection between the first inclined portion 326a and the plane perpendicular to the direction in which the first edge 320A extends (or the left-right direction). A line of intersection between the second inclined portion of the second machined surface 325 and a plane perpendicular to the direction in which the fourth edge 320D extends (or the top-bottom direction) may be formed to be longer than a line of intersection between the first inclined portion 326a and the plane perpendicular to the direction in which the fourth edge 320D extends (or the top-bottom direction).

According to an embodiment, a slope with respect to the horizontal plane parallel to the back surface (i.e., second surface 203) of the electronic device 200 may be the same between the line of intersection between the second inclined portion 324a of the first machined surface 324 and the plane perpendicular to the direction in which the first edge 320A extends (or the left-right direction) and the line of intersection between the first inclined portion 326a and the plane perpendicular to the direction in which the first edge 320A extends (or the left-right direction). The slope with respect to the horizontal plane parallel to the back surface (i.e., second surface 203) of the electronic device 200 may be the same between the line of intersection between the second inclined portion of the second machined surface 325 and the plane perpendicular to the direction in which the fourth edge 320D extends (or the top-bottom direction) and the line of intersection between the first inclined portion 326a and the plane perpendicular to the direction in which the fourth edge 320D extends (or the top-bottom direction).

The camera cover 320 may include a separation surface 327 which is spaced apart from an inner side surface 230a of the housing 230 (e.g., the inner side surface of the side member 231) and faces the inner side surface 230a of the housing 230. The separation surface 327 may correspond to a side surface of the camera cover 320. The separation surface 327 may have a slope different from that of the first inclined portion 326a. According to an embodiment, the separation surface 327 may be formed to be perpendicular to the one surface 232a of the first support member 232, which faces the back and to which the camera cover 320 is attached, and may extend along the first edge 320A and the fourth edge 320D.

The camera cover 320 may include a support rib 323 which comes in contact with the inner side surface 230a of the housing 230 to support the camera cover 320. The support rib 323 may include a plurality of support ribs. The support rib 323 may be formed to protrude from the separation surface 327 toward the side member 231. According to an embodiment, the plurality of support ribs may include a support rib 323 formed on the first edge 320A and/or the support rib 323 formed on the fourth edge 320D. The support rib 323 may be formed at a front end side of the separation surface 327, and a thickness of the support rib 323 in the front-back direction may be smaller than a thickness of the separation surface 327 in the front-back direction. Therefore, a contact area between the support rib 323 and the inner side surface 230a of the housing 230 may be smaller as compared to when the separation surface 327 comes in direct contact with the inner side surface 230a of the housing 230.

Since the camera cover 320 includes the separation surface 327 and the support rib 323, contact between the camera cover 320 and the inner side surface 230a of the housing 230 may be minimized, and thus the camera cover 320 may be stably supported at the housing while an assembly defect due to being caught between the camera cover 320 and the inner side surface 230a of the housing 230 is prevented.

The camera cover 320 may include an attachment surface 328 formed to be attached to the first support member 232. The attachment surface 328 may be formed on one surface of the camera cover 320 that faces the front. The attachment surface 328 is one surface of the camera cover 320 in the vicinity of the first to fourth edges 320A to 320D and may correspond to a portion of one surface of the camera cover 320 that overlaps with the first support member 232 when viewed from the front of the electronic device 200. According to an embodiment, the attachment surface 328 may extend along the first edge 320A and the fourth edge 320D.

The sealing member 330 may be attached to the attachment surface 328 of the camera cover 320 and may fix the camera cover 320 to the housing 230. According to an embodiment, the sealing member 330 may fix the first edge 320A and the fourth edge 320D to the one surface 232a of the first support member 232. The sealing member 330 may extend along the upper end edge 300A of the back plate 300 that is formed by the upper end edge 310A of the plate 310 and the first edge 320A of the camera cover 320, the left side end edge 300C of the back plate 300 that is formed by the left side end edge 310C of the plate 310, the right side end edge 300D of the back plate 300 that is formed due to the right side end edge 310D of the plate 310 and the fourth edge 320D of the camera cover 320, the lower end edge 300B of the back plate 300 that is formed by the lower end edge of the plate 310, and the corner portion 310E of the plate 310 that is in a state of being coupled to the second and third edges 320B and 320C.

A boundary of the attachment surface 328 that faces the side surface of the side surfaces 202 of the electronic device 200 may touch or abut a front end of the separation surface 327 and a front end of the second extending portion 324b of the first machined surface 324. According to the slope of the separation surface 327 and/or the second extending portion 324b, the position of the front end of the separation surface 327 and/or the front end of the second extending portion 324b touching or abutting the boundary of the attachment surface 328 may be changed, and a boundary of an outer periphery of the attachment surface 328 may also be changed. That is, it can be said that at least a portion of the attachment surface 328 is formed by the separation surface 327 and the second extending portion 324b.

According to an embodiment, the separation surface 327 and the second extending portion 324b may be bent with respect to the first inclined portion 326a and the second inclined portion 324a, respectively, and extend to be perpendicular to the one surface 232a of the first support member 232. An area of the attachment surface 328 that corresponds to the separation surface 327 and is attached to the housing 230 (e.g., the first support member 232) by the sealing member 330 may be larger than an area of the attachment surface 328 that corresponds to the second extending portion 324b and is attached to the housing 230 (e.g., the first support member 232) by the sealing member 330. That is, in the attachment surface 328 extending along the first edge 320A, an area attached by the sealing member 330 at a position corresponding to the first machined surface 324 may be smaller than an area attached by the sealing member 330 at another position. As the attachment surface 328 to which the sealing member 330 is attached becomes more adjacent to an outer side end of the first machined surface 324, which forms the exterior, along an edge (e.g., the first edge 320A), an area of the attachment surface 328 that is attached to the housing 230 (e.g., the first support member 232) by the sealing member 330 may be decreased.

In this way, while securing an exterior design by the second inclined portion 324a and the first protruding portion 234, the boundary of the outer periphery of the attachment surface 328 may become closer to the side surface of the side surfaces 202 of the electronic device 200 as compared to when the separation surface 327 and the second extending portion 324b extend with a slope which is the same as the slope of the first and second inclined portions 326a and 324a, and the attachment surface 328 may have a sufficient width for the sealing member 330 to be stably attached and exhibit waterproof performance.

Figure 13:
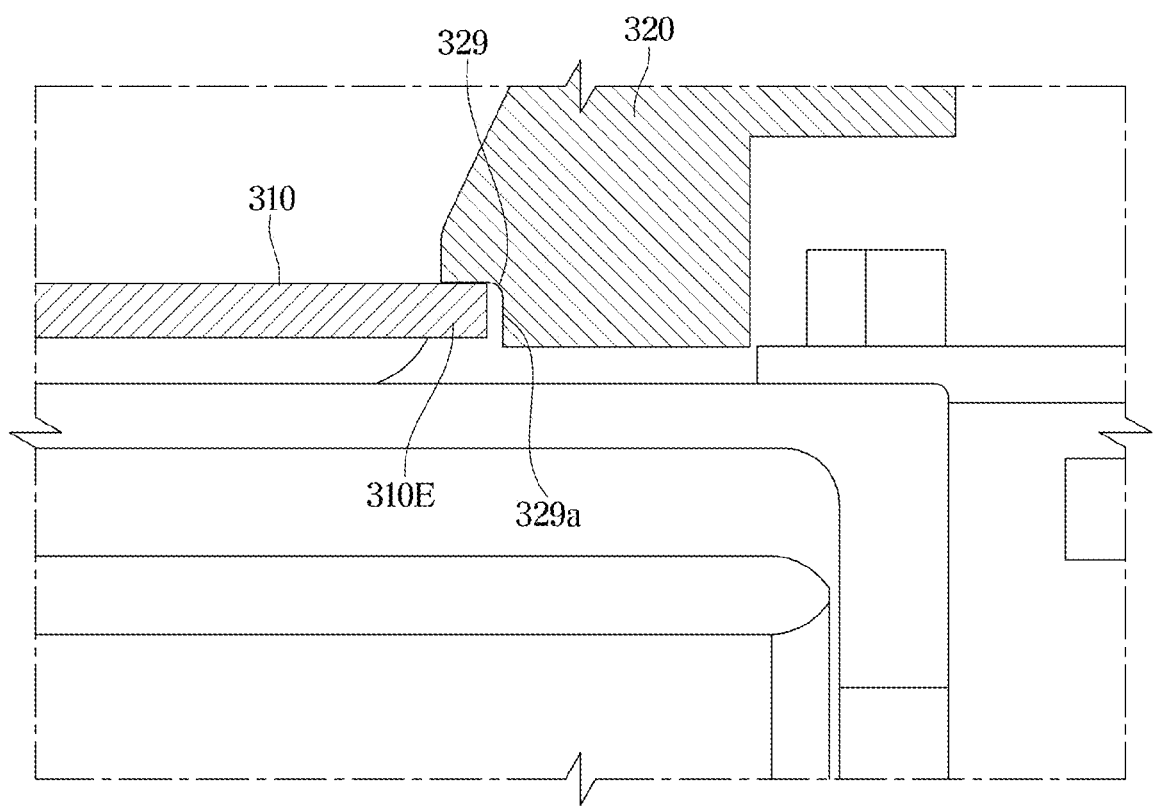
FIG. 13 is a view schematically illustrating a cross-section of an electronic device that is taken along line W-W' of FIG. 3 according to an embodiment of the disclosure.
Figure 14:
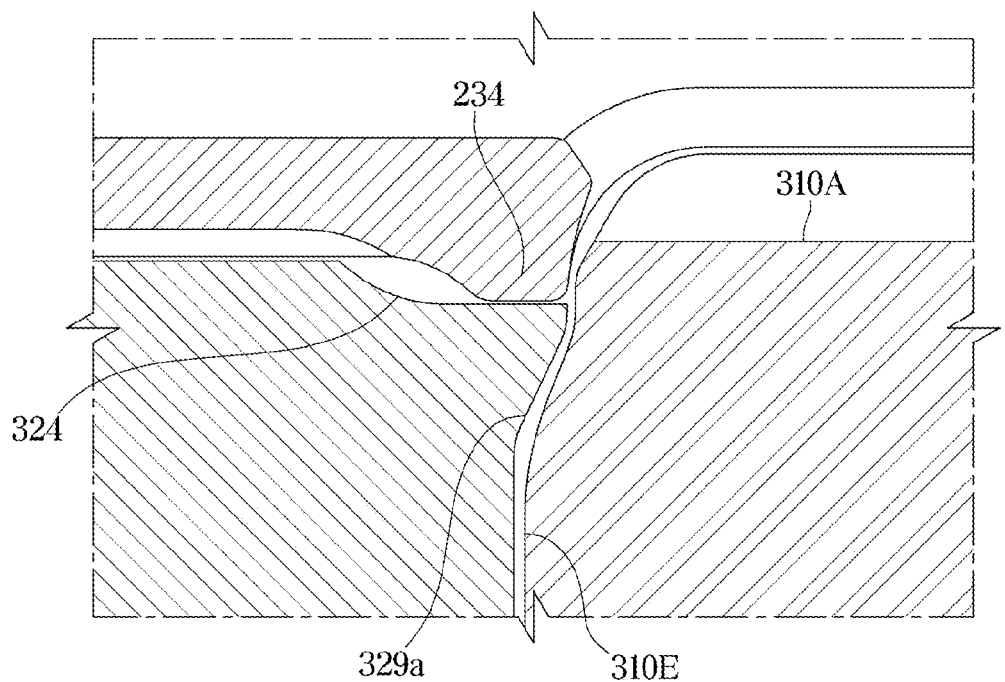
FIG. 14 is a schematic enlarged view of portion IX of FIG. 12 according to an embodiment of the disclosure.

FIG. 12 is a view schematically illustrating a cross-section of an electronic device that is taken along line V-V' of FIG. 4 according to an embodiment of the disclosure. FIG. 13 is a view schematically illustrating a cross-section of an electronic device that is taken along line W-W' of FIG. 3 according to an embodiment of the disclosure. FIG. 14 is a schematic enlarged view of portion IX of FIG. 12 according to an embodiment of the disclosure.

Referring to FIGS. 12 to 14, a camera cover 320 according to an embodiment may include a coupling groove 329 which is formed at a position corresponding to the corner portion 310E of the plate 310 and into which the corner portion 310E of the plate 310 is inserted to be coupled. According to an embodiment, the coupling groove 329 may extend along the second edge 320B and the third edge 320C of the camera cover 320. The coupling groove 329 may extend along the second edge 320B and the third edge 320C.

An inner surface 329a of the coupling groove 329 may be connected to the first and second machined surfaces 324 and 325. According to an embodiment, an inner surface of one portion of the coupling groove 329 that extends along the second edge 320B may have one end connected to the first machined surface 324. An inner surface of the other portion of the coupling groove 329 that extends along the third edge 320C may have one end connected to the second machined surface 325. Outer peripheral surfaces of the plate 310 except for the front and back surfaces of the plate 310 may extend to correspond to the coupling groove 329 and the first and second protruding portions 234 and 235. The outer peripheral surfaces of the plate 310 may come in contact with the first and second protruding portions 234 and 235 while coming in contact with the second and third edges 320B and 320C of the camera cover 320. The outer peripheral surfaces of the plate 310 may cover a portion of the camera cover 320 and a portion of the first and second protruding portions 234 and 235 when viewed from one side surface of the electronic device 200.

In this way, since the corner portion 310E of the plate 310 is inserted into the coupling groove 329, the coupling groove 329 may conceal the gap due to assembly tolerance, which is formed when the plate 310 and the camera cover 320 are coupled, and thus improve the exterior and may prevent or minimize infiltration of moisture or dust into the gap between the coupled plate 310 and camera cover 320 and thus improve waterproof performance of the back plate 300.

Figure 15:
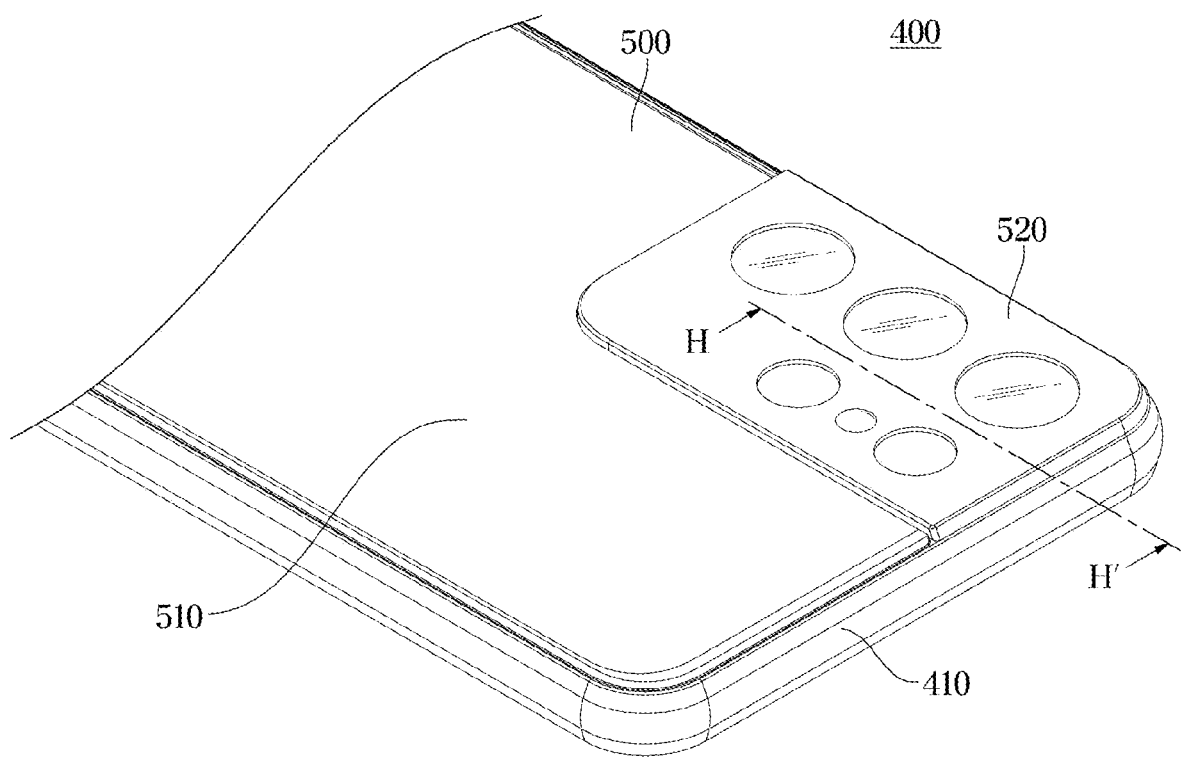
FIG. 15 is a view illustrating a back of an electronic device according to an embodiment of the disclosure.
Figure 15:
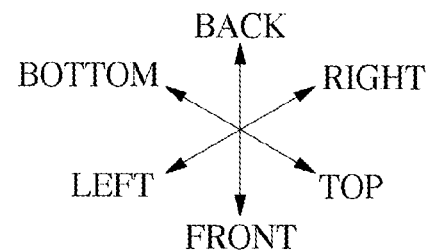
Figure 16:
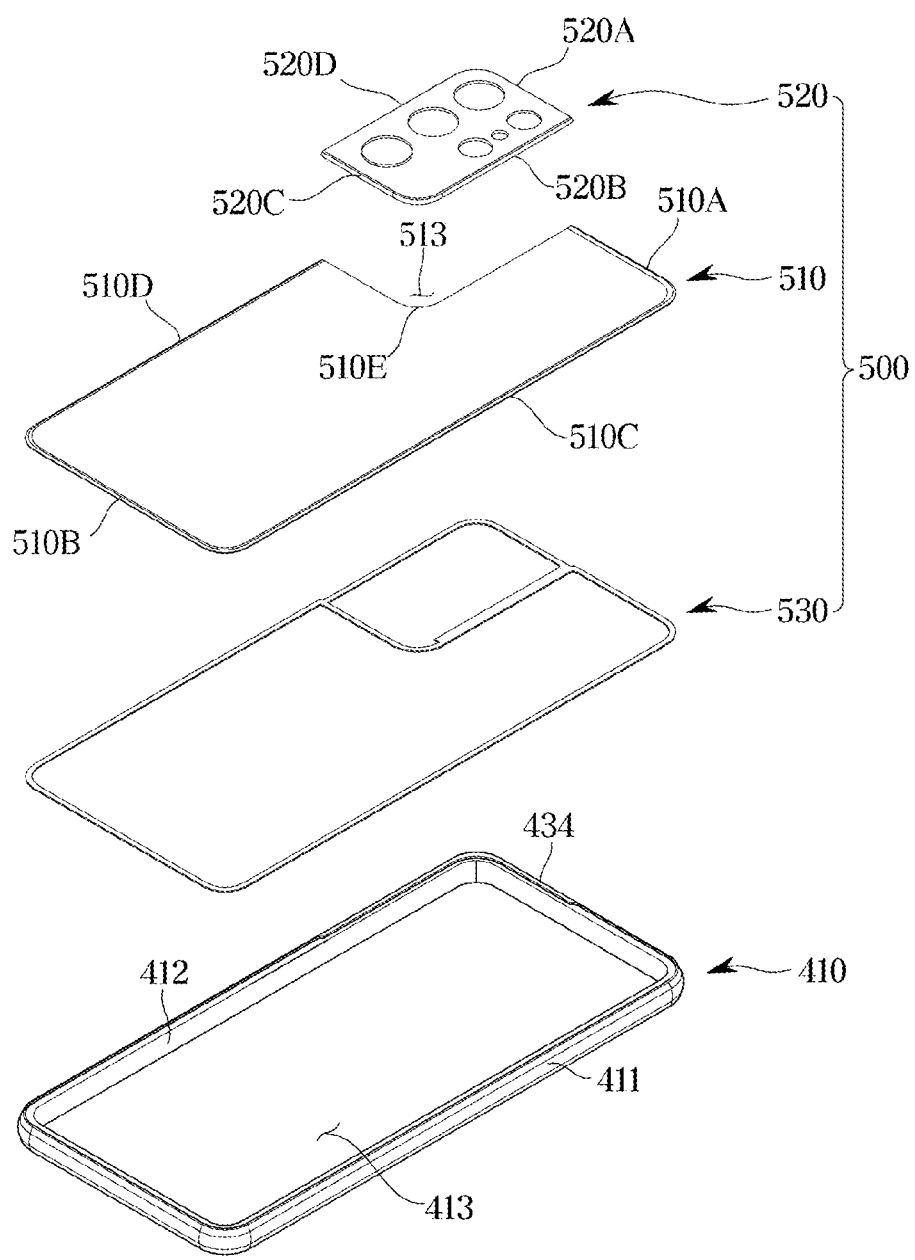
FIG. 16 is an exploded view of a housing and a back cover of an electronic device according to an embodiment of the disclosure.
Figure 17:
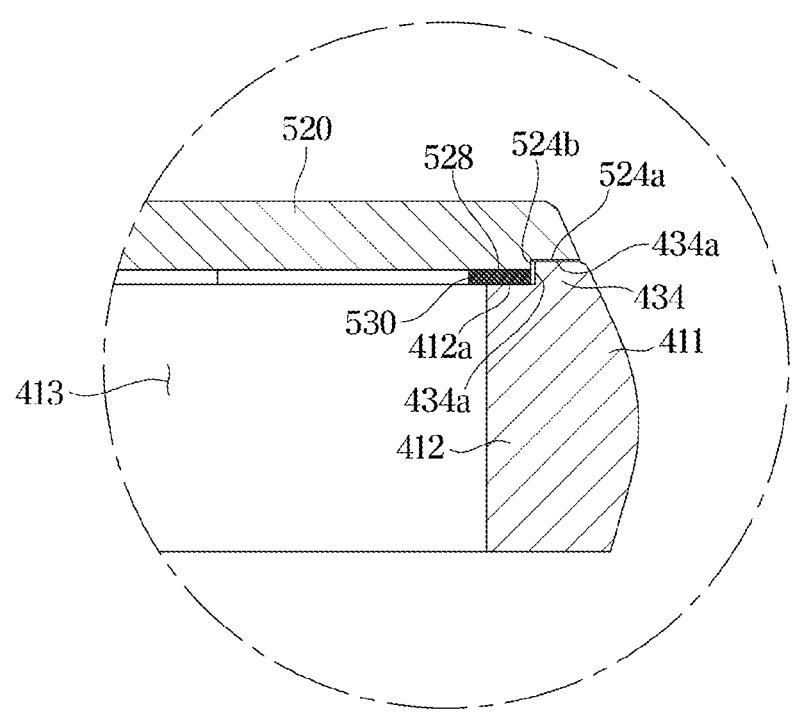
FIG. 17 is a view schematically illustrating a cross-section of an electronic device that is taken along line H-H' of FIG. 15 according to an embodiment of the disclosure.

FIG. 15 is a view illustrating a back of an electronic device according to an embodiment of the disclosure. FIG. 16 is an exploded view of a housing and a back cover of an electronic device according to an embodiment of the disclosure. FIG. 17 is a view schematically illustrating a cross-section of an electronic device that is taken along line H-H' of FIG. 15 according to an embodiment of the disclosure.

Referring to FIGS. 15 to 17, an electronic device 400 may include a back cover 500 which forms a back surface of the electronic device 400. The electronic device 400 may include a camera device (not illustrated) disposed in one area of an accommodation space 413 of a housing 410, and the back cover 500 may include a camera cover 520 which is provided at a position corresponding to the camera device to cover the camera device, a plate 510 which covers the other area of the accommodation space 413 in which the camera device is not disposed, and a sealing member 530 which couples the camera cover 520 and the plate 510 to the housing 410 and seals the accommodation space 413.

The plate 510 may include an upper end edge 510A, a lower end edge 510B, a left side end edge 510C, a right side end edge 510D, and a corner portion 510E. According to an embodiment, the upper end edge 510A may have a length shorter than that of the lower end edge 510B, and the right side end edge 510D may have a length shorter than that of the left side end edge 510C. The corner portion 510E may be concavely formed in an L-shape substantially toward an inner side of the plate 510. The plate 510 may form an opening 513 at a position corresponding to the camera device so that the camera device is exposed through the opening 513. The opening 513 may be closed by the camera cover 520.

The camera cover 520 may include first, second, third, and fourth edges 520A, 520B, 520C, and 520D. According to an embodiment, the first edge 520A may be connected to the upper end edge 510A of the plate 510, and the fourth edge 520D may be connected to the right side end edge 510D of the plate 510. The second edge 520B and the third edge 520C may correspond to the corner portion 510E of the plate 510. The first and fourth edges 520A and 520D may be coupled to the housing 410.

The housing 410 may include a side member 411 which forms an exterior of the electronic device 400 and surrounds the accommodation space 413 and a support member 412 which protrudes from an inner side surface of the side member 411 toward the accommodation space 413. The housing 410 may include a protruding portion 434 which is formed to protrude from the side member 411 toward the camera cover 520. According to an embodiment, the protruding portion 434 may extend to correspond to the first edge 520A and the fourth edge 520D of the camera cover 520 so that the protruding portion 434 may come in contact with the camera cover 520 and/or be coupled thereto.

The camera cover 520 may include machined surfaces 524a and 524b which are formed on edges as portions of the camera cover 520 are eliminated. The machined surfaces 524a and 524b may come in contact with an outer side surface 434a of the protruding portion 434. According to an embodiment, the machined surfaces 524a and 524b may extend along the first edge 520A and the fourth edge 520D of the camera cover 520.

The machined surfaces 524a and 524b may include a third extending portion, which is parallel to the back surface of the electronic device 400, and a fourth extending portion which is connected to one end of the third extending portion and has a slope different from that of the third extending portion. According to an embodiment, the fourth extending portion of machined surface 524b may extend to be perpendicular to one surface 412a of the support member 412 which faces the third extending portion of machined surface 524a and the back and to which the camera cover 520 is attached.

As the camera cover 520 is coupled to the housing 410, the protruding portion 434, which is in contact with the machined surfaces 524a and 524b, and one end of the third extending portion of machined surface 524a may be exposed to the outside and form an exterior of the electronic device 400.

The camera cover 520 may include an attachment surface 528 formed to be adhered to the support member 412. The attachment surface 528 may be formed on one surface of the camera cover 520 that faces the front. The attachment surface 528 is one surface of the camera cover 520 in the vicinity of the edges and may correspond to a portion of one surface of the camera cover 520 that overlaps with the support member 412 when viewed from the front of the electronic device 400. According to an embodiment, the attachment surface 528 may extend along the first edge 520A and the fourth edge 520D. A boundary of one side of the attachment surface 528 may touch or abut a front end of the fourth extending portion of machined surface 524b.

The sealing member 530 may be attached to the attachment surface 528 of the camera cover 520 and may fix the camera cover 520 to the housing 410. According to an embodiment, the sealing member 530 may fix the first edge 520A and the fourth edge 520D to the one surface 412a of the support member 412. The sealing member 530 may be provided in black to reduce visibility thereof.

In an embodiment, since the fourth extending portion of machined surface 524b extends from one end of the third extending portion of machined surface 524a so as to be perpendicular to the third extending portion of machined surface 524a, the attachment surface 528 to which the sealing member 530 is attached may be disposed closer to the center of the back cover 500 than the third extending portion of machined surface 524a, and since the sealing member 530 attached to the attachment surface 528 is covered by the third and fourth extending portions of machined surfaces 524a and 524b, the visibility of the sealing member 530 may be reduced, and the exterior of the electronic device 400 may be improved.

Each component (e.g., a module or program) according to various embodiments may be configured as a single entity or a plurality of entities, and some of the above-described corresponding subcomponents may be omitted, or other subcomponents may be further included in various embodiments. Alternatively or additionally, some components (e.g., modules or programs) may be integrated into a single entity and may perform functions performed by each of the corresponding components in the same or a similar way as before the integration. According to various embodiments, operations performed by a module, a program, or another component may be executed sequentially, in parallel, repeatedly, or heuristically, at least some of the operations may be executed in a different order or omitted, or another operation may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

DESCRIPTION OF REFERENCE NUMERALS 101, 200, 400: electronic device
230, 410: housing
280: camera module
300, 500: back plate
310, 510: plate
320, 520: camera cover
330, 530: sealing member
324, 524: machined surface
326: contact surface

The invention claimed is:

1. An electronic device comprising:
a housing forming an accommodation space;
a front cover coupled to a first side of the housing;
a back cover coupled to a second side of the housing opposite to the first side of the housing; and
a camera device disposed in a portion of an area of the accommodation space,
wherein the back cover comprises:
a plate covering a remaining portion of the area of the accommodation space, and
a camera cover covering the camera device, the camera cover comprising a first edge coupled to the housing and a second edge coupled to the plate.

2. The electronic device of claim 1,
wherein the housing comprises:
a side member surrounding the accommodation space and forming a side exterior of the electronic device, and
a support member protruding from the side member and comprising one surface attached to the back cover, and
wherein the camera cover further comprises:
a contact surface formed along the first edge and contacting the side member, and
an attachment surface attached to the one surface of the support member.

3. The electronic device of claim 2,
wherein the camera cover further comprises a machined surface formed at a position where the first edge and the second edge meet,
wherein the housing further comprises a protruding portion protruding from the side member and contacting the machined surface, and
wherein the protruding portion forms an exterior of the electronic device while contacting the machined surface.

4. The electronic device of claim 3, wherein the machined surface comprises:
an inclined portion tilting toward a center of the camera cover and extending toward the support member; and
an extending portion extending from one end of the inclined portion and perpendicular to the one surface of the support member to form the attachment surface.

5. The electronic device of claim 4,
wherein the inclined portion comprises a first inclined portion,
wherein the contact surface comprises a second inclined portion tilting toward the center of the camera cover and extending toward the support member, and
wherein a line of intersection between the first inclined portion and a plane perpendicular to a direction in which the first edge extends is longer than a line of intersection between the second inclined portion and the plane perpendicular to the direction in which the first edge extends.

6. The electronic device of claim 4,
wherein the inclined portion comprises a first inclined portion,
wherein the contact surface comprises a second inclined portion tilting toward the center of the camera cover and extending toward the support member, and
wherein a slope of a line of intersection between the first inclined portion and a plane perpendicular to a direction in which the first edge extends is substantially equal to a slope of a line of intersection between the second inclined portion and the plane perpendicular to the direction in which the first edge extends.

7. The electronic device of claim 3, wherein the camera cover further comprises a coupling groove formed along the second edge, the plate being inserted into the coupling groove to be coupled.

8. The electronic device of claim 7, wherein one end of an inner surface of the coupling groove is connected to the machined surface.

9. The electronic device of claim 8, wherein an outer peripheral surface of the plate extends to correspond to the coupling groove and the protruding portion.

10. The electronic device of claim 7,
wherein the coupling groove extends along a third edge of the camera cover, and
wherein the contact surface extends along a fourth edge of the camera cover.

11. The electronic device of claim 10,
wherein the machined surface comprises a first machined surface, and
wherein the camera cover further comprises a second machined surface formed at a position where the third edge and the fourth edge meet.

12. The electronic device of claim 3,
wherein the back cover further comprises a sealing member disposed between the housing and the back cover and configured to seal the accommodation space, the sealing member being attached to the attachment surface to fix the camera cover to the one surface of the support member,
wherein the attachment surface extends along the first edge, and
wherein, in the attachment surface, an area attached by the sealing member at a position corresponding to the machined surface is smaller than an area attached by the sealing member at another position.

13. The electronic device of claim 2, wherein the camera cover further comprises:
a separation surface formed along the first edge and spaced apart from the side member; and
a support rib protruding from the separation surface and contacting the side member.

14. The electronic device of claim 13, wherein a thickness of the support rib in a front-back direction is smaller than a thickness of the separation surface in the front-back direction.

15. The electronic device of claim 1, wherein the camera cover further comprises at least one camera window.

16. The electronic device of claim 1, wherein the camera cover further comprises a rectangular shape, first opposite corners of the rectangular shape comprising rounded corners and second opposite corners of the rectangular shape comprising machined surfaces less rounded than the first opposite corners.

17. The electronic device of claim 16, wherein the camera cover further comprises a coupling groove formed at one of the rounded corners of the camera cover and extending along two edges of the camera cover for coupling the camera cover to the plate by inserting the plate into the coupling groove.

18. The electronic device of claim 1, wherein the back cover comprises a rectangular shape, the camera cover defining a first corner of the rectangular shape of the back cover, the plate defining a second corner, a third corner, and a fourth corner of the rectangular shape of the back cover.

* * * * *